United States Patent [19]
Zingher

[11] Patent Number: 5,265,670
[45] Date of Patent: Nov. 30, 1993

[54] CONVECTION TRANSFER SYSTEM

[75] Inventor: Arthur R. Zingher, White Plains, N.Y.

[73] Assignee: International Business Machines Corporation, Armonk, N.Y.

[21] Appl. No.: 515,802

[22] Filed: Apr. 27, 1990

[51] Int. Cl.⁵ .................... F28F 7/00; H05K 7/20
[52] U.S. Cl. .................... 165/80.4; 357/82; 361/689
[58] Field of Search .......... 165/80.4, 80.5; 361/385, 382; 357/82, 83

[56] References Cited

U.S. PATENT DOCUMENTS

| | | | |
|---|---|---|---|
| 3,361,195 | 1/1968 | Meyerhoff et al. | 361/385 |
| 3,405,323 | 10/1968 | Surty et al. | 317/100 |
| 3,626,252 | 12/1971 | Cath | 317/100 |
| 4,069,497 | 1/1978 | Steidlitz | 357/80 |
| 4,072,188 | 2/1978 | Wilson et al. | 165/80 |
| 4,092,697 | 5/1978 | Spaight | 361/386 |
| 4,109,707 | 8/1978 | Wilson et al. | 165/46 |
| 4,151,547 | 4/1979 | Rhodes et al. | 357/81 |
| 4,226,281 | 10/1980 | Chu | 165/80 A |
| 4,233,645 | 11/1980 | Balderes et al. | 361/385 |
| 4,254,431 | 3/1981 | Babuka et al. | 357/82 |
| 4,258,411 | 3/1981 | Sherman | 361/386 |
| 4,323,914 | 4/1982 | Berndlmaier et al. | 357/82 |
| 4,341,432 | 7/1982 | Cutchaw | 339/112 L |
| 4,381,032 | 4/1983 | Cutchaw | 165/46 |
| 4,462,462 | 7/1984 | Meagher et al. | 165/80 C |
| 4,494,171 | 1/1985 | Bland et al. | 361/386 |
| 4,531,146 | 7/1985 | Cutchaw | 357/82 |
| 4,546,409 | 10/1985 | Yoshino et al. | 361/387 |
| 4,551,787 | 11/1985 | Mittal et al. | 361/387 |
| 4,558,395 | 12/1985 | Yamada et al. | 361/385 |
| 4,561,011 | 12/1985 | Kohara et al. | 356/46 |
| 4,561,040 | 12/1985 | Eastman et al. | 361/385 |
| 4,567,505 | 1/1986 | Pease et al. | 357/81 |
| 4,602,314 | 7/1986 | Broadbent | 361/386 |
| 4,607,277 | 8/1986 | Hassan et al. | 357/81 |
| 4,612,601 | 9/1986 | Watari | 361/387 |
| 4,635,709 | 1/1987 | Altoz | 361/385 |
| 4,639,829 | 1/1987 | Ostergren | 361/386 |
| 4,729,060 | 3/1988 | Yamamoto et al. | 165/80.4 |
| 4,730,665 | 3/1988 | Cutchaw | 165/80 |
| 4,730,666 | 3/1988 | Flint et al. | 165/80.4 |
| 4,758,926 | 7/1988 | Herrell et al. | 361/385 |
| 4,838,041 | 6/1989 | Bellows et al. | 165/80.2 |
| 4,866,570 | 9/1989 | Porter | 361/385 |
| 4,909,315 | 3/1990 | Nelson et al. | 361/385 |
| 4,940,085 | 7/1990 | Nelson et al. | 361/384 |
| 5,016,090 | 5/1991 | Gaylon et al. | 357/82 |
| 5,088,005 | 2/1992 | Ciaccio | 357/82 |

OTHER PUBLICATIONS

R. C. Chu, IBM TDB "Design for Providing Thermal Interface Material Between Narrow Thermal Interface Gaps", vol. 20, No. 7, Dec. 1977, pp. 2761-2762.

R. C. Chu et al., IBM TDB "Force-Free Solid Thermal Conduction Module", vol. 23, No. 3, Aug. 1980, pp. 1123-1124.

D. B. Tuckerman et al., "High-Performance Heat Sinking for VLSI", IEEE Electron Dev. Lett., vol. EDL-2, No. 5, May 1981, pp. 126-129.

Blodgett et al., "Thermal Conduction Module: A High-Performance Multilayer Ceramic Package", IBM J. Res. Develop., vol. 26, No. 1, Jan., 1982, pp. 30-36.

H. Martin, "Heat and Mass Transfer Between Impinging Gas Jets and Solid Surfaces", Advance Heat Transfer, vol. 13 (1977).

Primary Examiner—John Rivell
Assistant Examiner—L. R. Leo
Attorney, Agent, or Firm—Philip J. Feig

[57] ABSTRACT

A system provides convective transfer from a workpiece to a flowing fluid. A gap is formed between the workpiece and a facesheet containing fluid supply nozzles and fluid return nozzles. The fluid is fed to the supply nozzles, travels a short distance within the gap adjacent to the facesheet, and exits via return nozzles. The flow cross section and flow density facilitate heat transfer at a moderate flow rate and low fluid pressure. The system is also applicable for chemical transfer such as plating or etching printed circuit boards and for transfer through a semi-permeable membrane.

18 Claims, 23 Drawing Sheets

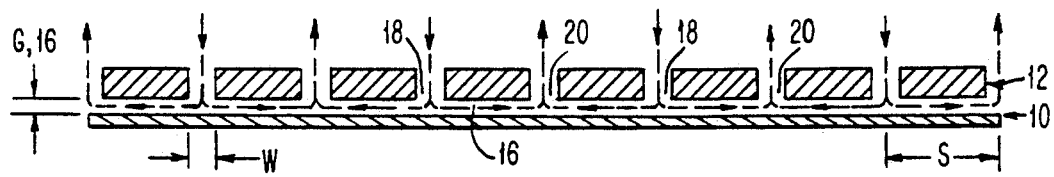
FIG. 1
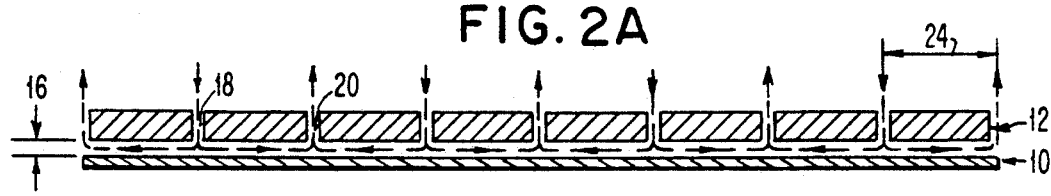
FIG. 2A
FIG. 2B
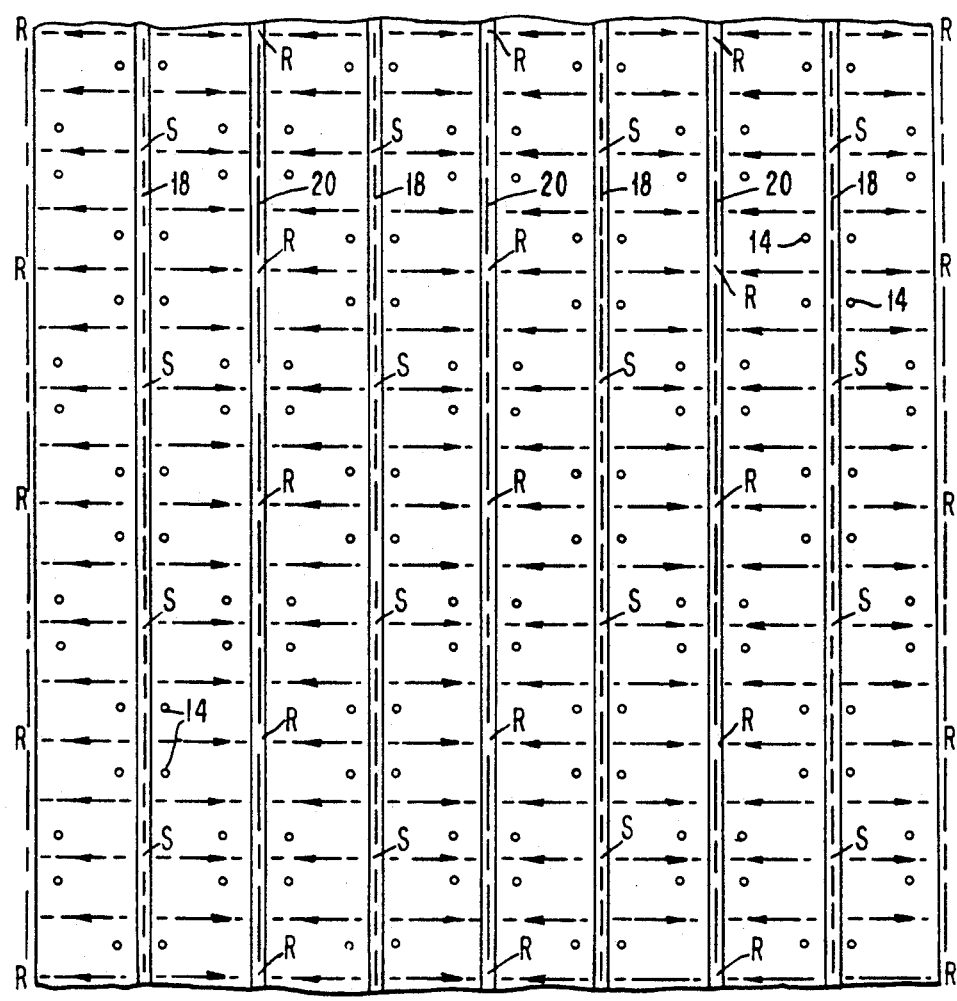

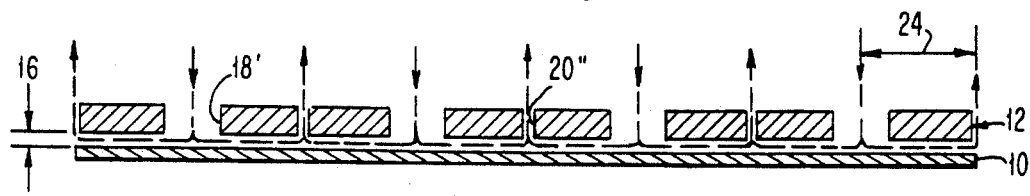
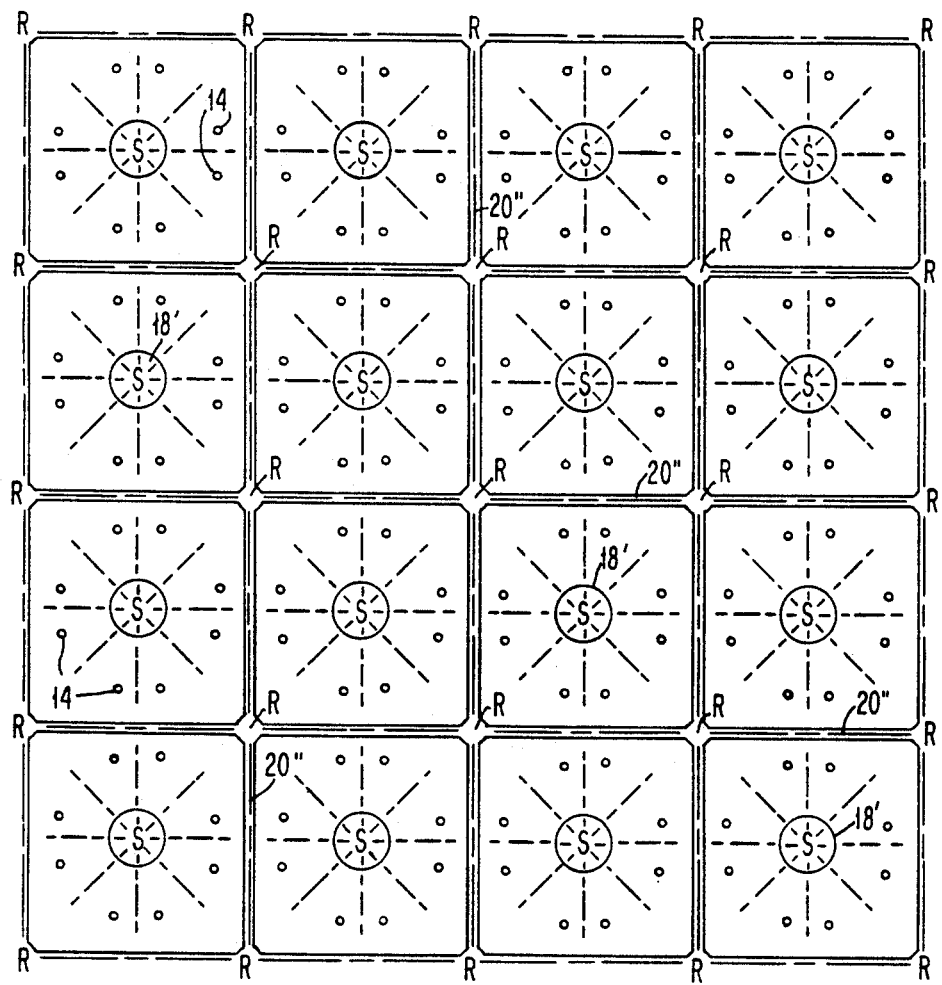

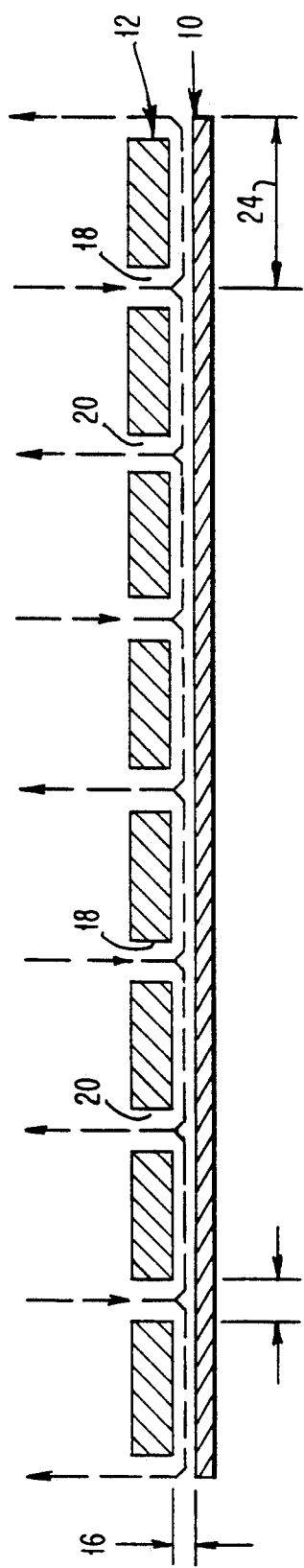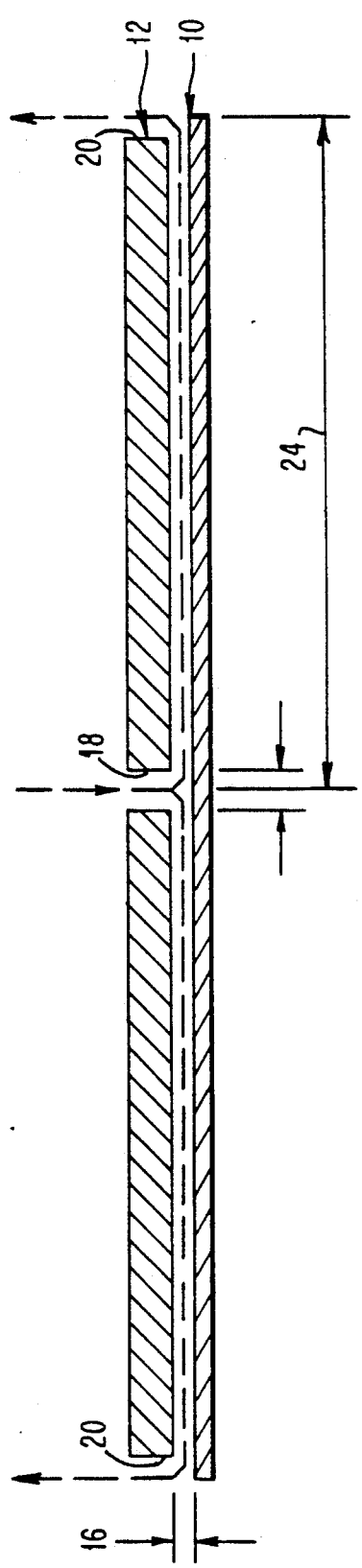

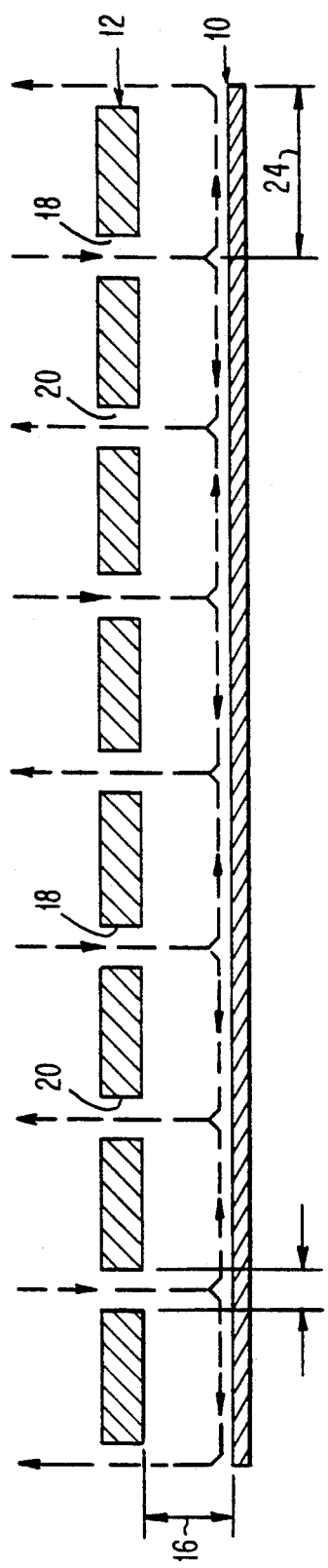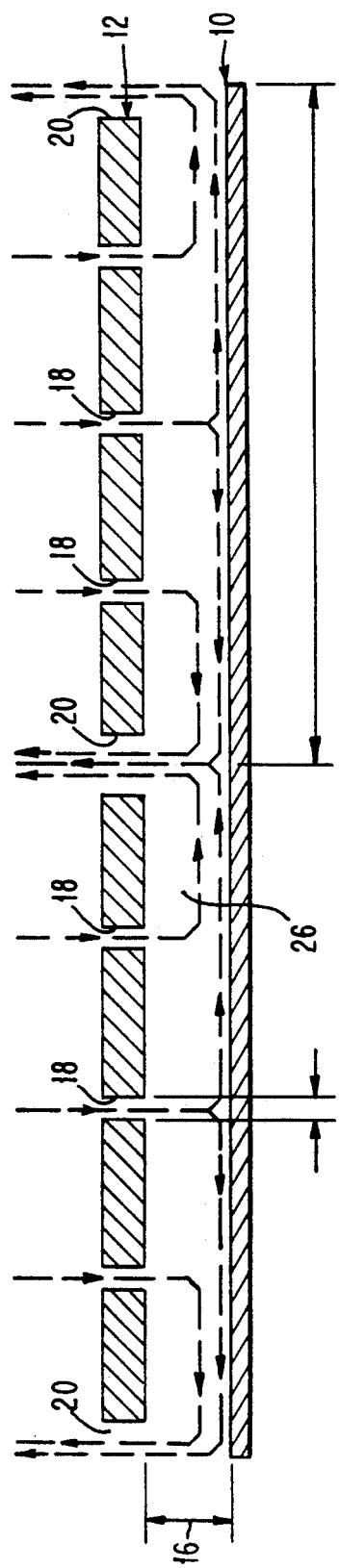

FIG. 22A
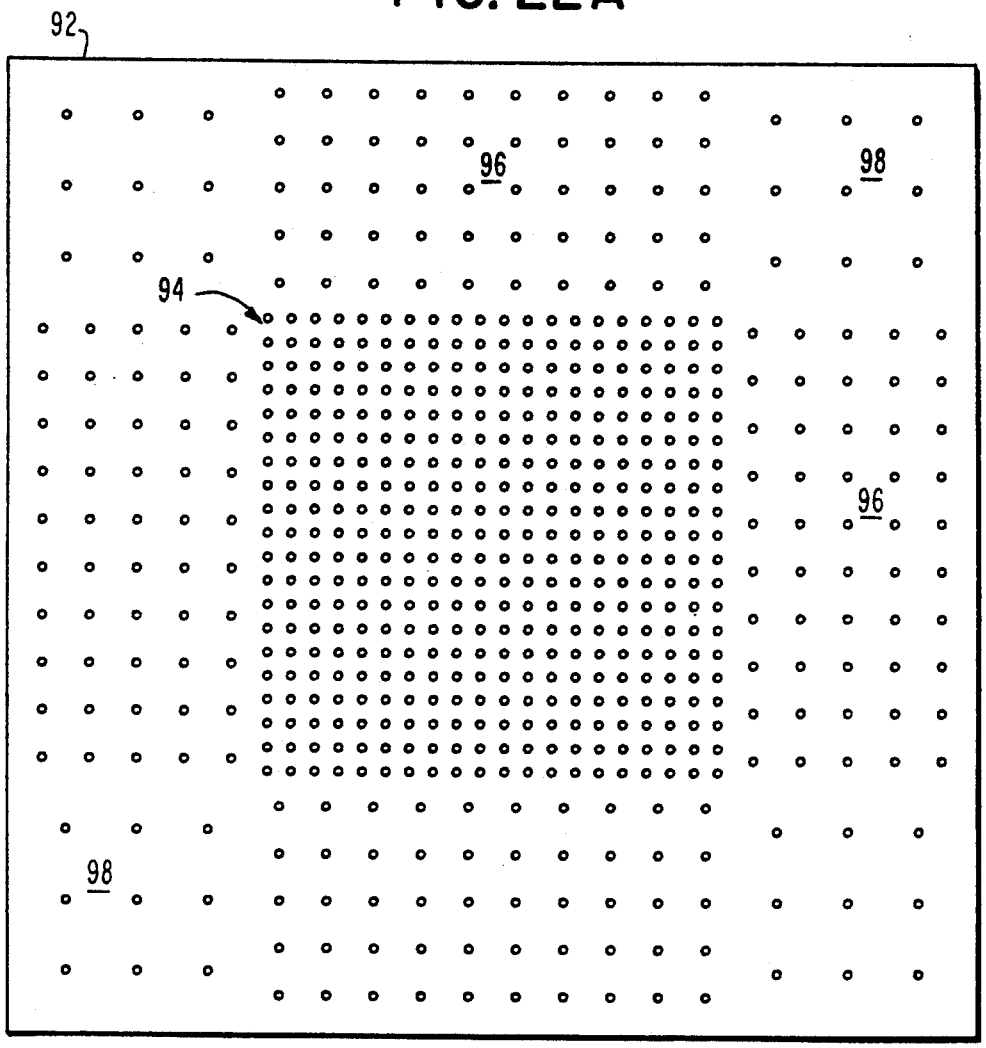
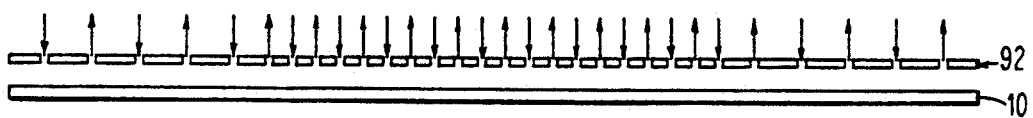
FIG. 22B

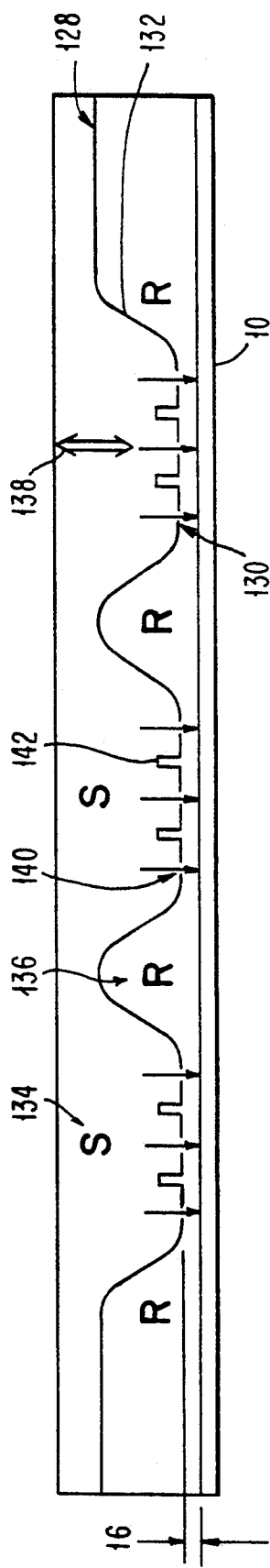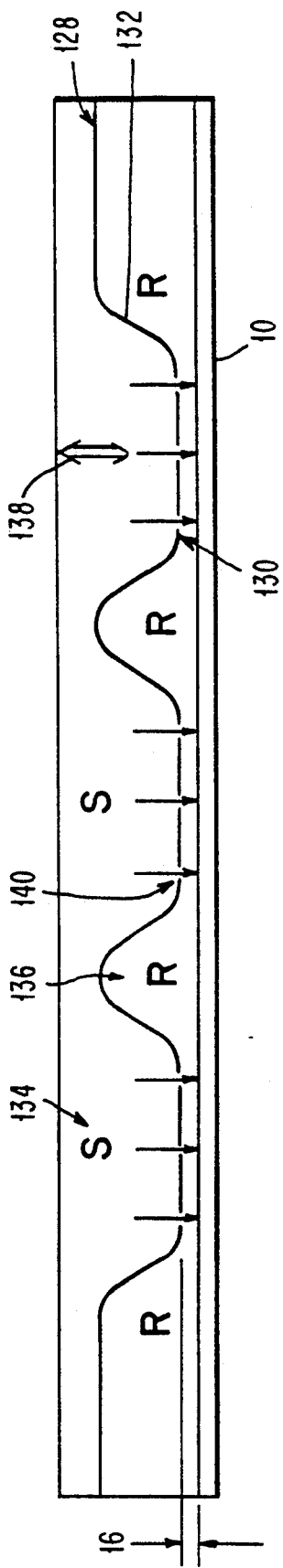

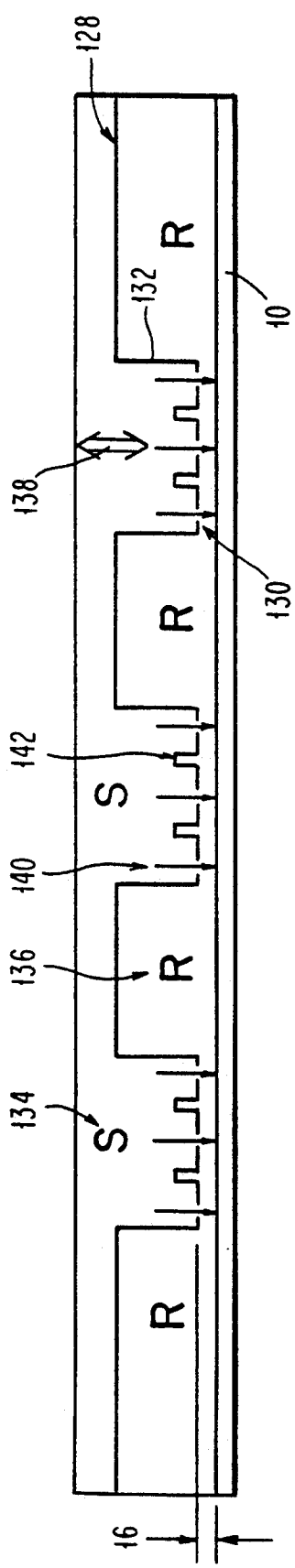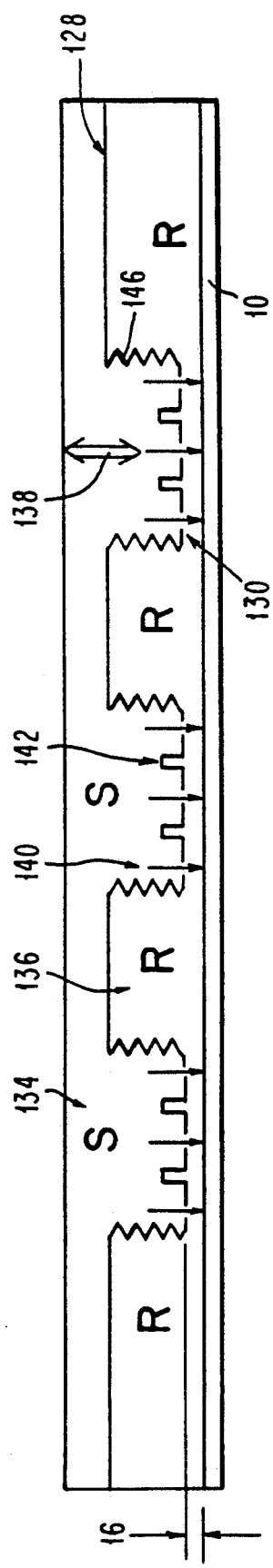

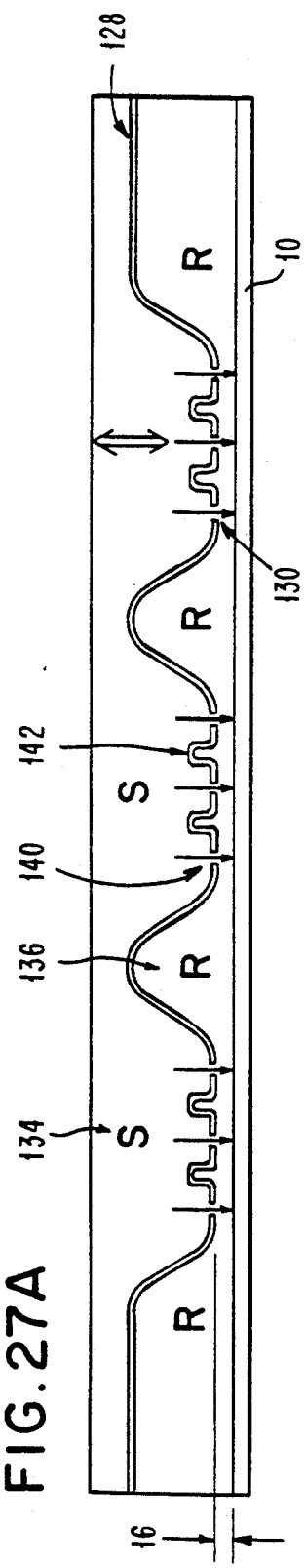
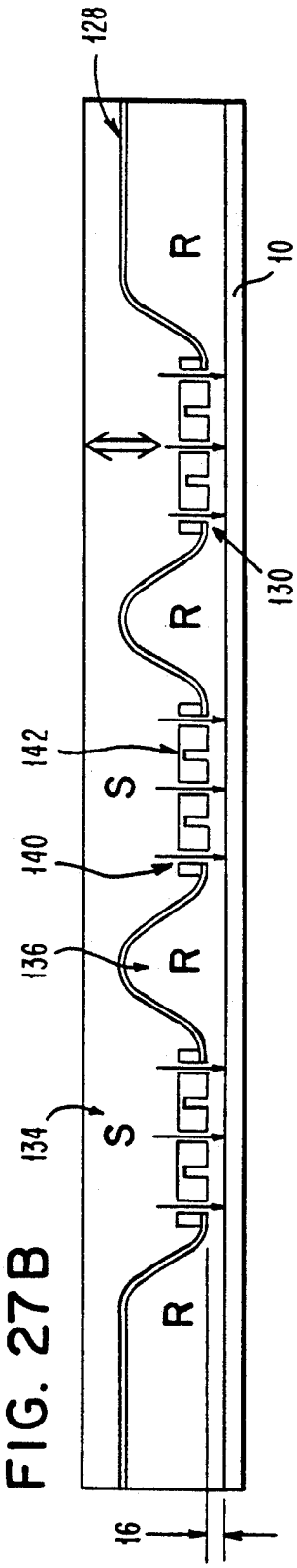
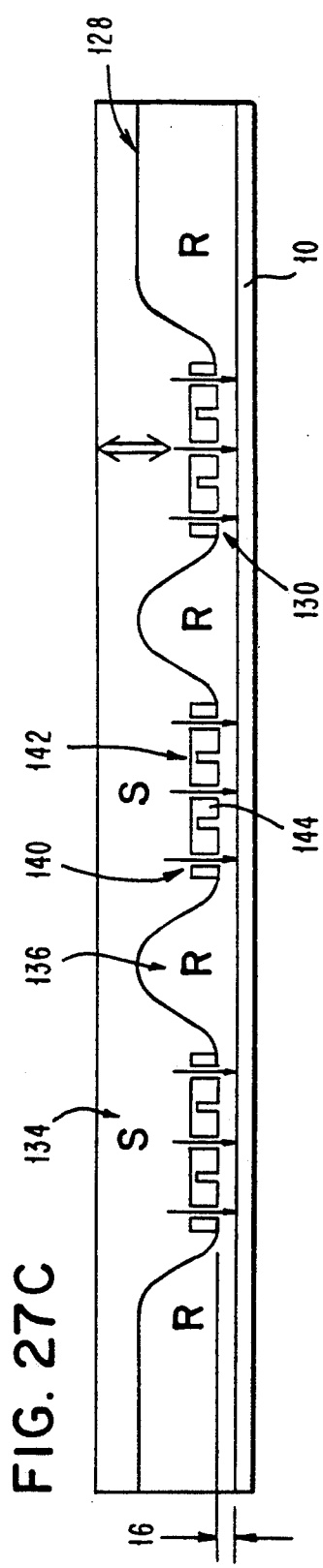
FIG. 27A
FIG. 27B
FIG. 27C

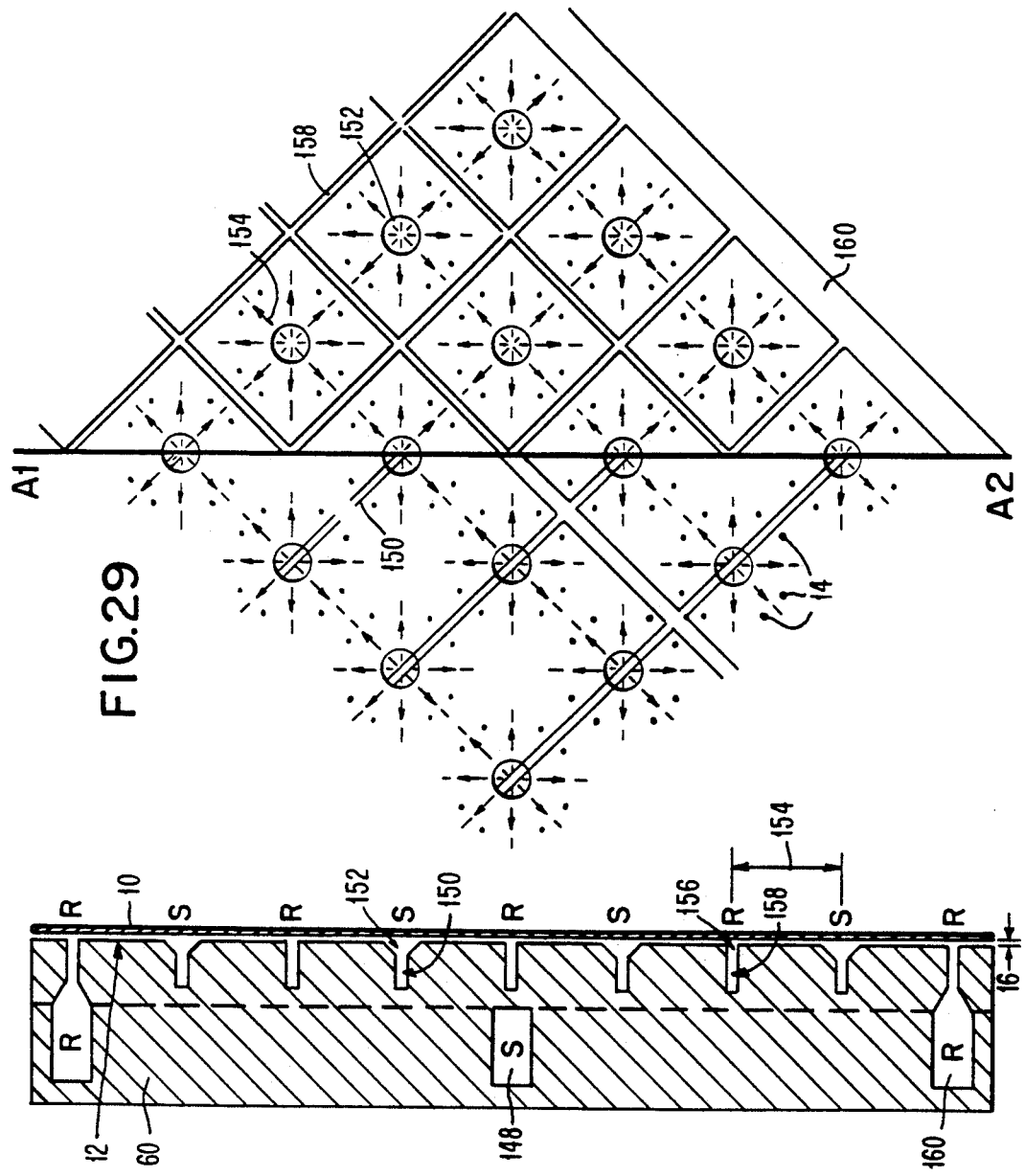

CONVECTION TRANSFER SYSTEM

BACKGROUND OF THE INVENTION

The present invention relates to a system for providing heat transfer between a smooth coldsheet and a flowing fluid. More specifically, a gap is formed between the coldsheet to be cooled and a facesheet containing many fluid supply and return nozzles. The fluid is fed to the supply nozzles, travels a short distance within the gap adjacent to the facesheet and exits via return nozzles. The flow cross section and flow density facilitate heat transfer at a moderate flow rate and low fluid pressure. The invention also has application for chemical transfer such as etching or plating printed circuit boards and for transfer through a semi-permeable membrane.

The term "intense heat transfer" is defined as the transfer of maximum heat when taking into consideration the following: the temperature difference between the coldsheet and incoming fluid, the area of the coldsheet, the thermal conductivity and specific heat of the fluid, and the use of a small fluid pressure drop.

The prior art contains many relevant structures useful for intense heat transfer. For instance, a theoretical discussion of cooling considerations is presented in an article in the IEEE Electron Devices Letters entitled "High Performance Heat Sinking For VSLI" by D. B. Tuckerman and R. F. Pease vol. EDL-2, No. 5, May 1981. The described arrangement requires many fine grooves and fins to be fabricated in a coldplate of highly thermal conductive material in order to achieve intense heat transfer. The fine fins and grooves are critical for achieving intense heat transfer. When relatively coarse fins and grooves are substituted, the heat transfer is less intense.

The technique of multiple jet impingement is described in the article "Impinging Jet Flow Heat and Mass Transfer" by Holfer Martin in Advances in Heat Transfer, Vol 13 (1977). The technique relied upon uses multiple nozzles and a relatively high fluid pressure to emit multiple jets of fluid with relatively high speed which impinges on a coldplate. When relatively small pressure is used the heat transfer is less intense. Also, as noted in the Martin article, cooling a large area by means of an array of jets results in degradation of the heat transfer near the center of the array.

Other prior art techniques increase heat transfer between a surface and adjacent flowing fluid by disrupting the boundary layer. One such example is loops of wire along the inner surface of a tube in a heat exchanger. Another example is a screen of wires along a surface which transfers heat to a flowing liquid. A stirrer refers to a structure which acts or is located near a surface, and promotes stirring, mixing, or turbulence in a flowing liquid. The stirrer may be integral with the surface, or may be an adjacent but distinct structure. Fins generally do not cause stirring, particularly in the regime of small or intermediate Reynolds' s number. A turbulator promotes turbulence, particularly at large Reynolds' number. The term stirrer generally includes "turbulator" but generally excludes fins. In general, a stirrer uses a large pressure gradient to achieve intense convection.

The prior art fails to teach how to achieve intense and uniform heat transfer from a large smooth sheet to a flowing fluid by means of a combination of low fluid pressure and medium fluid flow density.

SUMMARY OF THE INVENTION

The advantage of the present invention when compared to conventional fine groove forced convection cooling is the ability to achieve intense heat transfer using a coldsheet with simpler structure, simpler fabrication, and a wider choice of materials. The advantage of the present invention when compared to multiple jet impingement cooling is the ability to achieve intense heat transfer using a low fluid pressure and low fluid flow, and the ability to achieve uniform intense heat transfer over a large coldsheet area.

In practice, the invention starts with a smooth coldsheet. A facesheet having a plurality of closely spaced fluid supply nozzles and fluid return nozzles is provided. A manifold is coupled to the facesheet for guiding fluid to and from the nozzles. The manifold and facesheet are disposed in close proximity to the coldsheet so that a gap is formed between the facesheet and the coldsheet. The cooling fluid flows through the gap over the coldsheet. The supply nozzles and return nozzles are closely spaced so that the fluid flows along the coldsheet along many short path segments from a supply nozzle to a nearby return nozzle which are topologically parallel. The facesheet and the manifold may be fabricated with a degree of flexibility.

The present invention is applicable to processes in addition to cooling and which involve forced convection. Some such typical applications include indirectly cooling integrated circuit chips by thermal conduction through a coldsheet into a flowing fluid and directly cooling chips by a dielectric fluid which directly contacts the chips.

There are similarities between the convection of heat and the convection of chemicals. The present invention applies to both forms of convection. For example, the invention is useful in the fabrication of printed circuit boards using chemical or electro-chemical etching or plating.

Patent applications entitled "Thermal Joint" and "Compliant Fluidic Cooling Hat", assigned to the same assignee as the present application, also concerning heat transfer and cooling are being filed concurrently with the present application and are incorporated herein by reference.

The invention will be more clearly understood when the following description is read in conjunction with the accompanying drawings.

BRIEF DESCRIPTION OF THE DRAWINGS

FIG. 1 is a side elevation section view of a preferred embodiment of the present invention most clearly illustrating the principle of the present invention;

FIG. 2A is a side elevation section view of an embodiment of a facesheet useful for practicing the present invention;

FIG. 2B is a top plan view of the facesheet shown in FIG. 2A;

FIG. 4A is a side elevation view of an alternative embodiment of a facesheet useful for practicing the present invention;

FIG. 4B is a top plan view of the facesheet shown in FIG. 4A;

FIG. 7 is a side elevation section view of a facesheet disposed opposite a coldsheet for forming a gap therebetween;

FIG. 8 is a side elevation section view of a facesheet disposed opposite a coldsheet for forming a gap therebetween;

FIG. 9 is a side elevation section view of a facesheet disposed opposite a coldsheet for forming a gap therebetween;

FIG. 10 is a side elevation section view of a facesheet disposed opposite a coldsheet for forming a gap therebetween;

FIG. 22A is a top plan view of a facesheet useful for practicing the present invention;

FIG. 22B is the side elevation view of the facesheet shown in FIG. 22A;

FIGS. 26A to 26D are side elevation views of manifold sheets for chip-wise convection cooling;

FIGS. 27A to 27C are side elevation views of fabrication techniques of manifold sheets;

FIG. 28 is side elevation section view of a preferred embodiment of the invention for cooling a large sheet; and FIG. 29 is a top plan section view of the embodiment shown in FIG. 28.

DETAILED DESCRIPTION

Figure 3A:
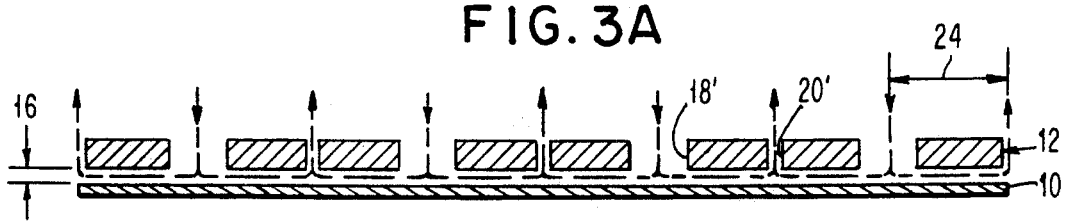
FIG. 3A is a side elevation view of another embodiment of a facesheet useful for practicing the present invention.

Referring now to the figures and to FIG. 1 in particular, there is shown a side elevation section view of preferred embodiment of the present invention most clearly illustrating the principle of the present invention. In order to facilitate an understanding of the invention, the drawings are shown with exaggerated vertical separation of the elements of the figures. A coldsheet 10 is separated from a perforated facesheet 12 by thin spacers (not shown). A flowing fluid (indicated by arrows) is urged through the gap 16 between the coldsheet and facesheet. An array of supply nozzles 18 provide a cold supply fluid which flows in the gap 16 along the surface of the coldsheet 10 where heat is absorbed and warm fluid flows through return nozzle 20. The supply nozzles 18 and return nozzles 20 alternate along the faceplate 12. The spacing between the nozzles is selected to minimize the length of contact with the coldsheet, i.e. the path segment of the fluid, while maximizing the quantity of heat removed form the coldsheet. Pumps and conduits for providing the cold supply fluid and exhausting the warm fluid are not shown. The direction of fluid flow is shown by the dashed arrows. The nozzles preferably are in the shape of rectangular slots or circles or any other shape.

FIG. 2A is a side elevation section view of an array of slotted supply nozzles and slotted return nozzles. FIG. 2B is a top plan view of the facesheet 12 showing an array of slotted supply nozzles 18 and slotted return nozzles 20. Also visible in FIG. 2B are the spacers 14 separating the faceplate form the coldsheet.

Figure 3B:
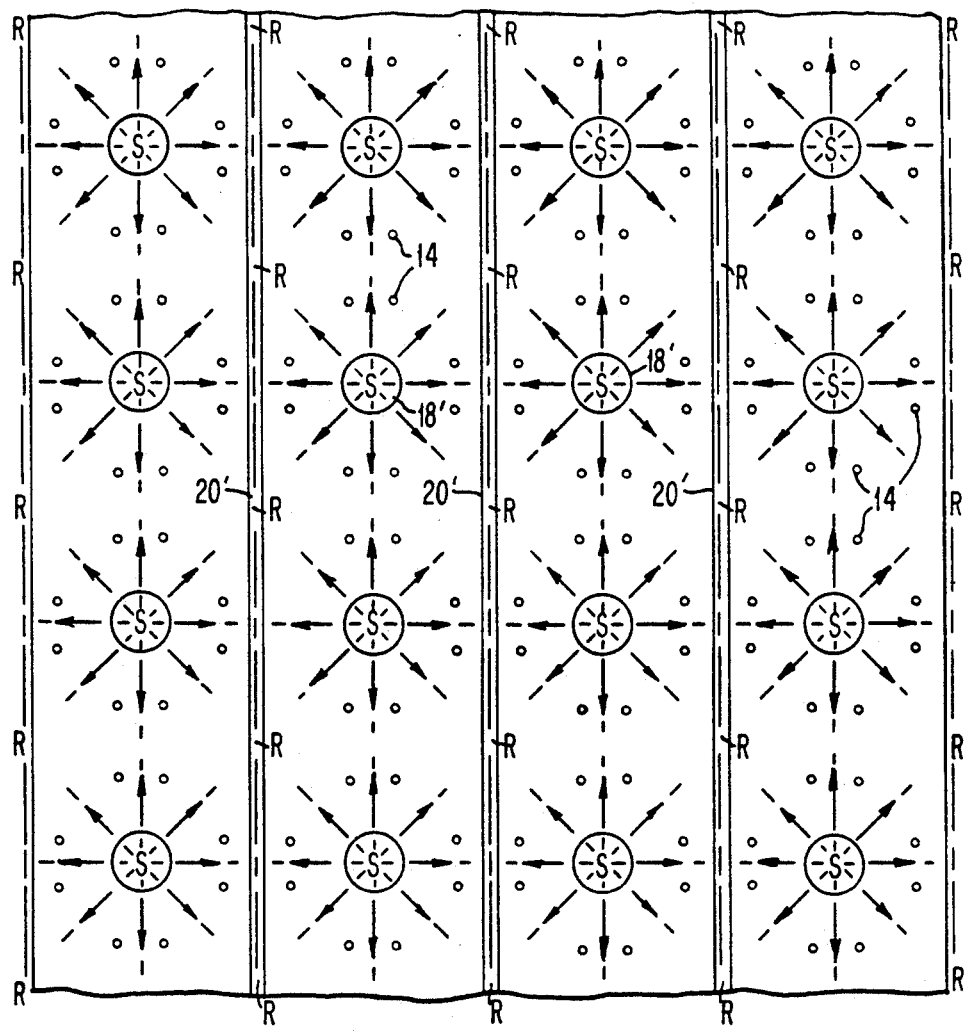
FIG. 3B is a top plan view of the faceplate shown in FIG. 3A.

FIG. 3B is a top plan view of a modified facesheet showing circular supply nozzles 18' and slotted return nozzles 20'. FIG. 3A is a side elevation section view of the facesheet shown in FIG. 3B.

In a further modification shown in FIGS. 4A and 4B, supply nozzles 18' are interspersed within a grid of slotted return nozzles 20". The return warm fluid flows outward in a plane parallel to the plane of the drawing as shown.

Figure 5A:
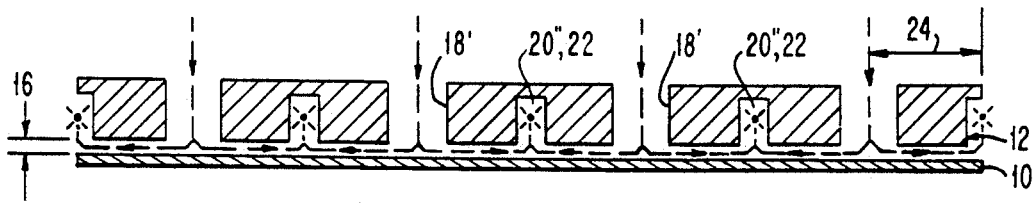
FIG. 5A is a side elevation view of an alternative embodiment of a facesheet useful for practicing the present invention.
Figure 5B:
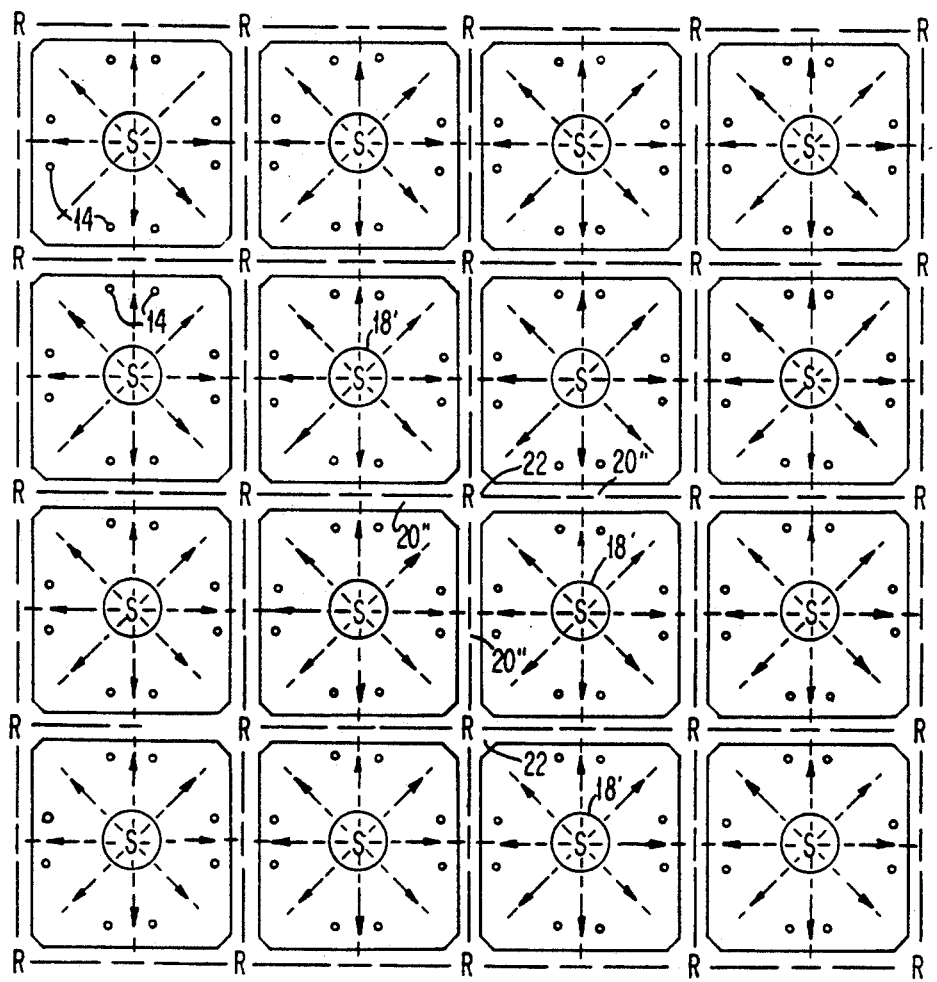
FIG. 5B is a top plan view of the facesheet shown in FIG. 5A.

FIGS. 5A and 5B show an array of circular supply nozzles 18' interspersed within a grid of slotted return nozzles 20" and small return conduits or capillaries 22. The return nozzles and associated conduits are recessed in the bottom surface of the facesheet opposite the coldplate, and return fluid flows horizontally outwards as in the arrangement in FIGS. 4A and 4B. Warm fluid flows through the small return capillaries 22, flowing parallel to the facesheet surface. In order to provide adequate flow cross section taking into account the number of capillaries requires that each capillary 22 be relatively wide and deep compared to the long narrow slot return nozzles 20".

Figure 6A:
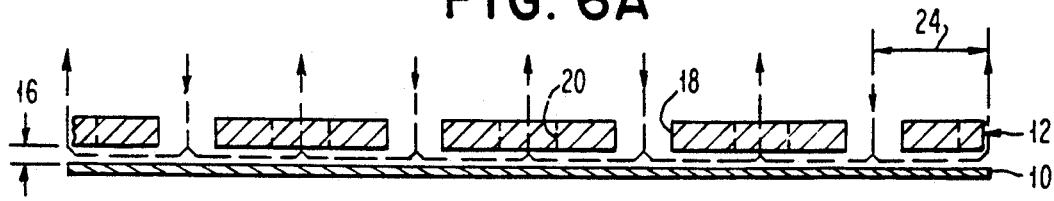
FIG. 6A is a side elevation section view of a further alternative embodiment of a facesheet useful for practicing the present invention.
Figure 6B:
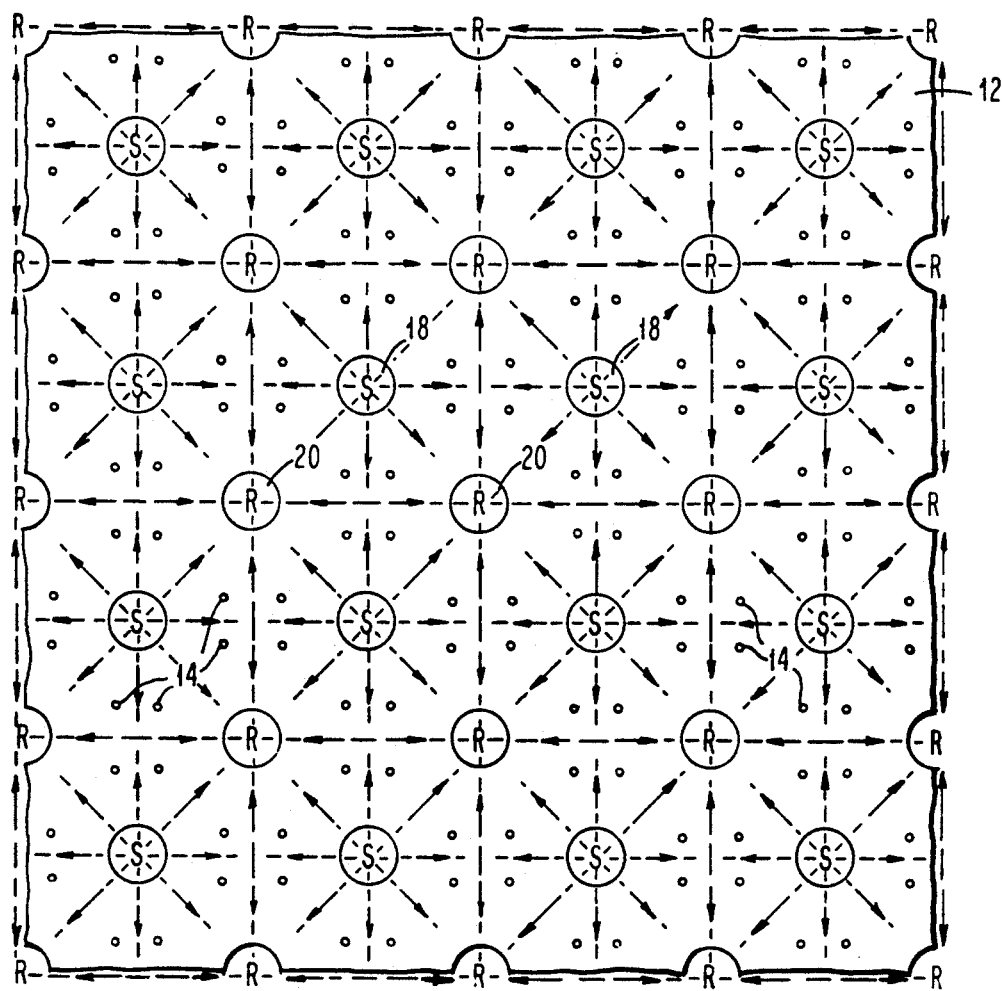
FIG. 6B is a top plan view of the facesheet shown in FIG. 6A.

FIGS. 6A and 6B show an alternative arrangement where there is an array of circular return nozzles 20 and circular supply nozzles 18.

While the above figures show the gaps and nozzles enlarged for the sake of clarity, typical dimensions are as follows. In FIGS. 2 through 6, the gap between the coldsheet and facesheet and hence, the thickness of the spacers 14 is preferably approximately 0.05 mm. As seen in the plan views, these spacers 14 cover disconnected spots where there is no interference with the flow. The gap dimension determines all the other dimensions. The nozzle and conduit widths are calculated so that the slotted supply nozzle width is approximately twice the gap dimension or 0.10 mm. The circular supply nozzle diameter is approximately four times the gap dimension or 0.20 mm. Each slotted return nozzle is made equal to the gap dimension or 0.05 mm. The return capillary 22 has a width four times the gap dimension a 0.20 mm and a depth of approximately eight or more times the gap dimensions or a minimum of 0.40 mm. Each circular return nozzles has a diameter approximately four times the gap width, or 0.20 mm. The segment distance 24, measured between the centers of adjacent supply and return nozzles, is eight times the gap dimension or 0.40 mm. The pitch between nozzle centers is approximately twice the segment distance and is measured as follows. In FIGS. 2, 3 and 4 measure between two successive slotted return nozzles, in FIG. 2 measure between two successive slotted supply nozzles, and in FIGS. 3, 4 and 5 measure between two successive circular supply nozzles.

In the preferred embodiment, the fluid is water flowing at a flow density of 4 cm/sec. In other words, the water flow is 4 $cm^3$/sec per $cm^2$ of coldsheet area.

For maximum heat transfer, the cooling arrangement design should have the most optimal design parameters which are nevertheless both feasible and useful. For instance, the shortest spaces, thinnest supply nozzles, shortest segment distance and largest flow density (i.e.: flow/corresponding coldsheet area) are the preferred design. Heat transfer and flow adjacent to the coldsheet are subject to degradation effects, including fouling, corrosion, clogging on or near the coldsheet. Conversely, the materials used and system chemistry may limit heat transfer intensity thereby rendering useless optimal design parameters. Practical pumps, hoses, chillers and pressure limit the feasible flow density.

The relationship between fluid and flow density strongly depends on the gap, pitch, and segment widths. To minimize pressure as a function of flow density requires ample flow cross section at every stage. In a preferred embodiment, this area is typically about 1/20 of the corresponding coldsheet area.

Some applications can tolerate less intense heat transfer, and/or lower flow density, and/or higher pressure. Such applications can tolerate a smaller area ratio (e.g. 1/50 or even 1/100). The use of a smaller ratio results in less favorable flow density as a function of pressure and limited heat transfer intensity.

The present invention uses moderate fluid flow rate (speed) at every stage. Typically a flow rate of approximately one M/S is used. Thus, the term "nozzle" does not connote high fluid speed in the present invention. This is in contrast with jet impingement cooling, which typically uses a considerably smaller area ratio and higher pressure to produce a high speed jet of fluid in order to promote heat transfer.

When considering a given set of parameters for gap, flow density and pitch, different performance is achieved when using slotted nozzles as contrasted with circular nozzles. Depending upon the flow density, the slotted nozzles may provide somewhat more uniform cooling. However, circular nozzles provide somewhat more intense cooling (when averaged over the area of the entire coldsheet). The choice of embodiment depends upon the application. On the other hand, a slightly smaller supply nozzle width will add a predictable upstream pressure drop. The result is improved predictability of flow and heat transfer in the presence of manufacturing tolerances and other system perturbations.

The specific cooling application determines the optimal parameter values, that is, the highest feasible parameter values. The application also determines those values which are acceptably within feasibility limits and which limit the outer parameter. Throughout the following description of the present invention, the following symbols will be used. G is the gap between the coldsheet and the facesheet, W is the slot width D is the nozzle diameter, S is the segment distance between the centers of adjacent nozzles, and FD is the flow density.

The following table indicates typical values for each dimension for different design conditions (tight, relaxed and loose).

| design/parameter | G | W | D | S | FD |
| --- | --- | --- | --- | --- | --- |
| Tight | 0.05 | 0.10 | 0.20 | 0.40 (mm) | 4 ($cm^3$/sec per $cm^2$ of coldsheet area) |
| Relaxed | 0.20 | 0.40 | 0.80 | 1.60 (mm) | 1 ($cm^3$/sec per $cm^2$ of coldsheet area) |
| Loose | 0.80 | 1.60 | 3.20 | 6.40 (mm) | 0.25 ($cm^3$/sec per $cm^2$ of coldsheet area) |

Two logically distinct mechanisms, gap width and thermal boundary layer inside the gap, each independently promote intense heat transfer. When the gap is tight and the thermal boundary layer (TBL) is inside the gap, the TBL must be thin. This situation is most relevant to "fully developed convection". As fluid flows through a tight supply nozzle, a thin stream with medium-fast speed is formed. The stream flows along a short segment distance along the surface of the coldsheet. There is only a brief interval during which the thermal boundary layer thickens. Therefore, the thermal boundary layer is thin. This situation is most relevant to "partially developed convection".

In both of the above situations the thermal boundary layer is thin so heat can readily conduct from the coldsheet, through the TBL, into the flowing fluid. Also the "heat transfer coefficient" varies inversely with TBL thickness. Thus, when the TBL is thin the heat transfer is intense.

A so-called "tight" embodiment is shown in FIG. 7. A "semi-relaxed" embodiment is similar to the tight embodiment, but has certain parameters which are relaxed and other parameters which are tightened. If properly performed, one of the above mechanisms still applies, even though the other mechanism is relaxed. Semi-relaxed embodiments are shown in FIGS. 8 to 10, 11A, 11B, 12A, and 12B as will be described below. The mechanism partially apply to each semi-relaxed embodiment and hence, a major portion of the goals and performance of the tight embodiment are achievable using the semi-relaxed embodiments.

"Fully relaxed" embodiments which differ even more from the tight embodiment relax both mechanisms. Therefore, the fully relaxed embodiments have less intense heat transfer than the other embodiment types.

The modified designs can be embodied with various horizontal structures, such as shown in FIGS. 2 through 6. The following descriptions will refer to the parallel slotted nozzle structure shown in FIGS. 2A and 2B as a representative embodiment. In order to relax the segment distance parameter value while maintaining a small gap distance the following dimensions are used. The gap 16 is set to a small value G=0.05 mm. As noted above, the gap dimension is used for determining other cooling system parameters and for scaling the heat transfer intensity. Concurrently, the segment distance 24 is lengthened to a value of 1.60 mm. The nozzle width, i.e. the slot widths, are not critical in this example, the width W can be in the range from 0.10 to 0.40 mm for a slotted supply nozzle and D can be in the range from 0.20 to 0.80 mm for a circular supply nozzle. The return nozzles should be at least the same area as the supply nozzles. The flow density is tight, for example, $FD=4$ cm/sec=4 cm$^3$/sec per cm$^2$ of coldplate area. The horizontal structure is any of the configurations shown in FIGS. 2B, 3B, 4B or 5B. The critical parameter is the tight gap and the thin thermal boundary layer within the gap applies, and the heat transfer is intense.

A longer segment length results in a less favorable pressure versus flow density profile. In order to achieve the same flow density along a longer segment the fluid must flow faster and hence the pressure gradient becomes larger. The pressure gradient increases as a function of distance and the pressure drop concurrently becomes quadratically larger. If the resulting higher pressure drop is tolerable the described embodiment is very favorable. As a result of the increased pressure and flow rate, the time to flow along the longer segment is approximately the same as with the lower pressure and flow rate. Depending upon the flow density, the thermal boundary later thickness is largely determined by the gap, and largely independent of the supply nozzle width.

As the segment become progressively longer a design conflict between longer segment and limited pressure, ample flow density and intense heat transfer develops. Thus after a certain segment length there is a degradation of performance.

Another modification of the invention is to relax the gap thickness parameter but maintain tight values for supply nozzle width and pitch parameters. The gap thickness 16 is not critical and can assume any value from a tight design to a relaxed design and the value does not determine the other dimensions, nor does the gap value directly effect cooling. For example, the gap distance may be set at $G=0.40$ mm. The supply nozzle 18 width (diameter) is tight, e.g. $W=0.10$ mm for a slotted supply nozzle or $D=0.20$ mm for a circular supply nozzle. It is the slot or diameter value which sets the scale for the other parameter values and reciprocally scales the heat transfer intensity. The pitch is made equal to twice the gap distance (0.40 mm) which is equal to eight times the slot width. The pitch is also made equal to twice the supply nozzle diameter. The segment distance 24 is also selected to be tight. The segment distance is equal to four times the slot width or twice the supply nozzle diameter. The return nozzle width is equal to or larger than the supply nozzle width, but is otherwise not a critical design parameter. The flow density is made tight, for example, $FD=4$ cm/sec=4 cm$^3$/sec per cm$^2$ of coldplate area. The horizontal structure is as shown in any of the embodiments shown in FIGS. 2B, 3B, 4B, 5B, or 6B. The tight gap mechanism is not effective here. However, the thin thermal boundary layer mechanism is effective, and the result is good heat transfer. In the just described embodiment the gap width does not affect heat transfer. However, if the gap distance becomes too larger there is a significant reduction of the heat transfer.

Figure 11A:
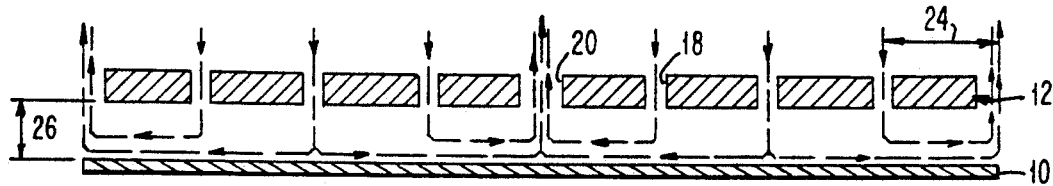
FIG. 11A is a side elevation section view of an embodiment of a facesheet for practicing the present invention.
Figure 11B:
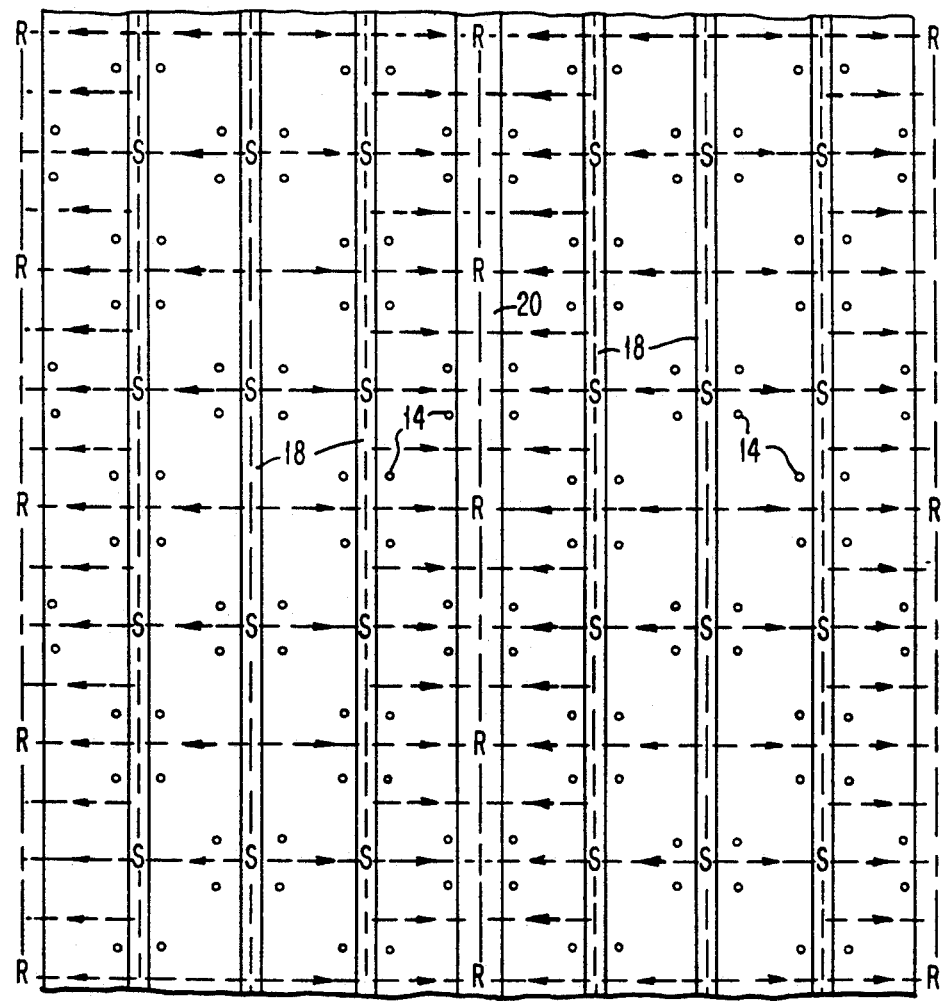
FIG. 11B is a top plan view of the facesheet shown in FIG. 11A.

In a further embodiment the gap distance and return pitch values are relaxed while the supply nozzle width and supply pitch are maintained tight. Typical dimensions are described below. The supply nozzle width is tight, e.g. $W=0.10$ mm for slotted supply nozzle or $D=0.20$ mm for a circular supply nozzle. These parameter values set the values for the other parameters, and reciprocally scale the heat transfer intensity. The supply nozzle pitch is tight, e.g., the pitch is eight times the slot width or four times the diameter. The return nozzle pitch value is relaxed. The return nozzle pitch is 32 times the slot width or 16 times the diameter of the circular supply nozzle. It is possible for multiple supply nozzles to provide fluid to a single return nozzle. In FIGS. 11A and 11B, for instance, three supply slots 18 are provided for each return slot 20. In FIGS. 3B, 4B and 5B there are multiple circular supply nozzles 18' for each slotted return nozzle 20', 20", 22. In the present arrangement, the gap thickness 16 is not critical. For example, the gap thickness is 0.20 mm and flow density is selected to be tight, $FD=4$ cm/sec=4 cm$^3$/sec per cm$^2$ of coldsheet area.

Referring to FIG. 10 the flowing fluid streamlines are adjacent and parallel to the coldsheet. In gap region 26 the fluid streamlines stack up resulting in locally reduced heat transfer. The design shown is a compromise which relaxes the gap and return pitch parameters but and still yields moderately intense heat transfer. In an application which can operate at such a heat transfer intensity, the described arrangement is an allowable embodiment. Generally, however, tighter embodiments which result in better heat transfer are preferable.

A still further alternative embodiment provides for the selection of all relaxed parameters. General principles of fluid mechanics and heat transfer show that such an embodiment will result in less intense heat transfer. Therefore, such an embodiment is less preferred, but may be useful in less demanding applications. Typical parameter dimensions are as follows. The gap is 0.20 mm. The nozzle widths are 0.20 mm for a slotted supply nozzle and 1.60 mm for a circular supply nozzle, while the pitch is twice the segment distance. The segment distance is 1.60 mm. The fluid flow density is 1.0 cm/sec. Therefore cooling is one-quarter as intense as the optimal arrangement. A similar dimensional scaling can be applied to the embodiments shown in FIGS. 2A, 2B, 3A, 3B, 4A, 4B, 5A and 5B, and the cooling intensity is similarly reduced. In the arrangement shown in FIG. 8 the wide gap 16 compensates for the larger pressure caused by longer pitch.

As parameters are changed from tight to relaxed to loose the cooling becomes correspondingly less intense. Although the boundary between classifications of cooling is gradual and not abrupt, and depends on the particular embodiment and application, excessively loose cooling systems are not the intended result of the present invention, but such a result is within the broad teachings of the present invention.

The embodiments described show similar features. There is a flowing fluid, a heated coldsheet to be cooled, a facesheet having a plurality of closely spaced supply nozzles and return nozzles and a gap between the coldsheet and facesheet. The cold fluid flows through a supply nozzle, removes heat from coldsheet while flowing through the gap and the warm fluid exits through a return nozzle. General design parameters include a thin gap, a narrow slotted supply nozzle, closely spaced supply nozzle and return nozzles and a medium flow density.

It will be understood by those skilled in the art, that in the field of fluid mechanics, it is customary to measure magnitudes by a "Reynolds' number", defined as follows:

$$Re = \frac{L \times V}{nu}$$

where L is a characteristic distance, V is a characteristic fluid speed, and nu is the kinematic viscosity of the fluid. For a circular flow passage, L is defined as the diameter. For a narrow slot or narrow rectangular gap, L is defined as twice the width. For other passage shapes, L is defined as four times the flow cross-section area divided by the wetted perimeter. This value L is sometimes referred to as the "hydraulic diameter". The principle of the present invention therefore is applicable to other embodiments than those described and illustrated when one skilled in the art, considers Reynolds' scaling and Reynolds' number, criteria. For the tight embodiment, described above, the following situation applies.

For a given gap, let L be twice the gap.

$$Re_{Gap} = \frac{1M/S \times 2 \times 0.050E - 3M}{1E - 6M^2/S} = 100$$

For a slotted supply nozzle, let L be twice the slot width.

$$Re_{Slot\ Nozzle} = \frac{1M/S \times 2 \times 0.050E - 3M}{1E - 6M^2/S} = 100$$

For a circular supply nozzle, let L be the diameter.

$$Re_{Circular\ Nozzle} = \frac{1M/S \times 2 \times 0.200E - 3M}{1E - 6M^2/S} = 200$$

The nozzle pitch should be compared to the gap width or the nozzle size, whichever is smaller.

Ratio$_{Pitch}$ ≡ Nozzle Pitch/Gap Width
Ratio$_{Pitch}$ ≡ Nozzle Pitch/Nozzle Width $$= \frac{0.400E - 3M}{0.050E - 3M} = 8$$

The distinctive features of the invention can be expressed more generally. In accordance with the present invention the gap Reynolds number is small. Thus, Re$_{Gap}$=1000 is poor, 300 is fair, 100 is preferred, even smaller is excellent. The nozzle Reynolds number is small. Thus, Re$_{nozzle}$=1,000 is poor, 300 is fair, 100 is preferred, even smaller is excellent. The pitch ratio is made as small as possible. Thus, Ratio=80 is poor, 25 is fair, 8 is preferable, even smaller is excellent.

In addition to causing intense heat transfer, the present invention can cause intense transfer of materials or other quantities between a smooth object (such as a coldsheet) and an adjacent flowing fluid. The finless local surface geometry may be superimposed on almost any long-range geometry, either nearly flat, or curved, or with large structures, such as coarse fins.

Some embodiments of the invention can cause intense heat transfer from a coldsheet with shallow stirrers, or many (but not all) other shallow structures. Thus this invention can be used with a wide variety of coldsheet structures and still achieve intense heat transfer which previously required fine grooves or fast fluid jets. As used herein the term "smooth" will be used for both truly smooth surfaces as well as the kinds of additional surfaces mentioned above.

The invention has application in fields in addition to cooling. For example, many important processes are controlled by diffusion and forced convection between a smooth surface and a fluid flowing over the surface. Both mass and heat transfer are included as well as transfer from a fluid to a surface and vice versa.

As used herein the term "convective transfer" refers to all such processes. The term "workpiece" refers to a coldsheet or any other surface which participates in convective transfer.

The following are specific applications of the present invention: systems to cool heat producing electronic components by indirect cooling where fluid flows past a sheet which is heated by conduction from heat-producing components connected to the sheet; or by direct cooling where a fluid flows directly over heat-producing components; systems where the fluid is a liquid, a gas or a fluid containing suspended droplets, particles, or various mixtures; systems where the fluid changes phase from liquid to solid boiling or form mist to vapor evaporation; and cryogenic cooling systems where the fluid is liquid nitrogen, cold helium gas, or liquid helium. More generally, cryogenic cooling includes (but is not limited to) liquid or gas as the fluid, and includes intermediate cryogenic temperatures (like boiling nitrogen) or extreme cryogenic temperatures (like boiling helium). The invention is also applicable to heating systems for transferring heat from a hot fluid to a cold workpiece.

Another class of processes is chemical machining or chemical fabrication of a workpiece including processes which are subtractive or additive and which are chemical or electro-chemical. Applications include macrofabricating large features or microfabricating fine features such as a printed circuit board (PCB). Another class of processes concerns material transfer without a chemical reaction such as evaporation from a workpiece to a gas as in drying wet paper or other sheet product or cleaning a workpiece by erosion or deposition from a fluid to a workpiece including deposition in a gas or in a liquid. A further class of processes is mechanically depositing or removing small particles to or from a workpiece. A still further class of processes combines convection with chemical reaction in fluid, such as combustion heating of a workpiece. There are many more examples throughout the chemical industry.

In still another class of processes the workpiece is a non-solid object which includes a membrane with fluid flowing on both sides. The invention is also useful in applications where transport proceeds very readily through the membrane and the overall intensity is determined by convection and diffusion in the adjacent fluids. Some examples are desalination plants, kidney dialysis machines, and electrochemical fuel cells. However, the invention is less useful in other applications where the membrane itself greatly limits the transport intensity.

Figure 13:
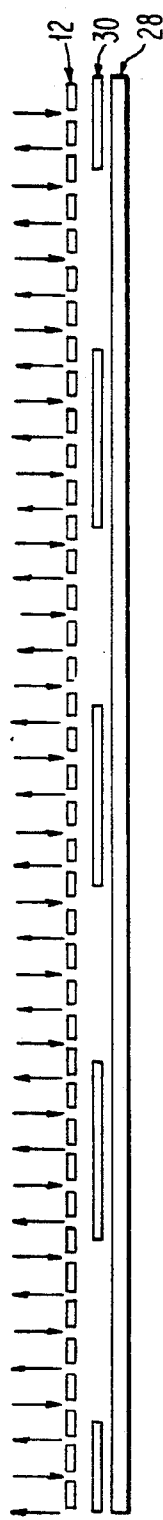
FIGS. 13 to 16 are schematic illustrations of the invention as used to etch a pattern in a printed circuit board.

FIG. 13 illustrates schematically the manner by which the invention can be used to etch a pattern to fabricate a printed circuit board. The heat transfer fluid is replaced by an etchant fluid. The coldsheet is replaced by a printed circuit board 28 substrate containing a resist pattern 30. The facesheet 12 and other items are the same as described above. The spacers (not shown) are located where the desired pattern does not require removal of material. A related concept allows etching a blank printed circuit board 28 not containing a resist pattern.

Figure 14:
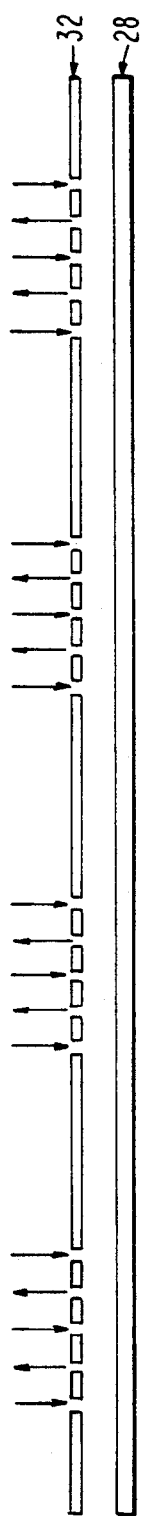
Figure 15:
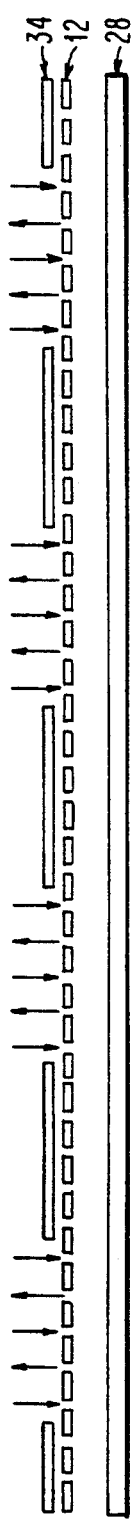
Figure 16:
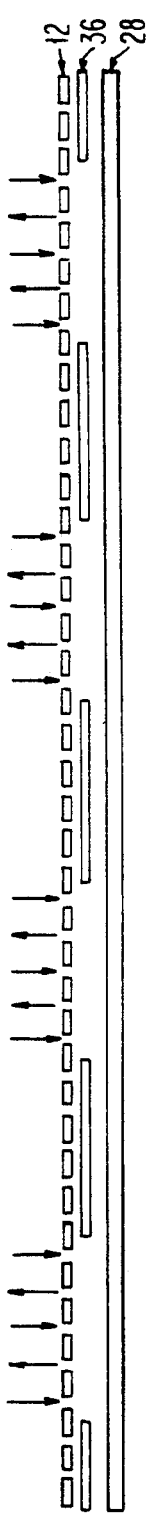

In FIG. 14, a personalized facesheet 32 replaces the facesheet 12. In FIG. 15 an upper personalized barrier 34 is used in combination with the facesheet 12. In FIG. 16 a lower personalized barrier 36 and facesheet 12 are used to define the printed circuit board geometry. The same embodiments apply to "additive fabrication" of printed circuit boards where metal is plated onto a blank substrate.

The embodiments shown in FIG. 13 through 16 offer especially rapid etching and enhanced productivity. In the embodiments shown in FIGS. 14, 15, and 16 there is a potential cost advantage by eliminating resist application for each successive printed circuit board.

In order to guide fluid to each supply nozzle and from each return nozzle, there is a manifold with conduits. As used herein the terms "ducts", "channels" or "capillaries" refer to conduits having a diameter in the range of 10 mm, 1 mm, or 0.1 mm respectively. In some instance conduits are integrated with the facesheet. In other instance, the conduits form a part of a manifold.

Figure 17:
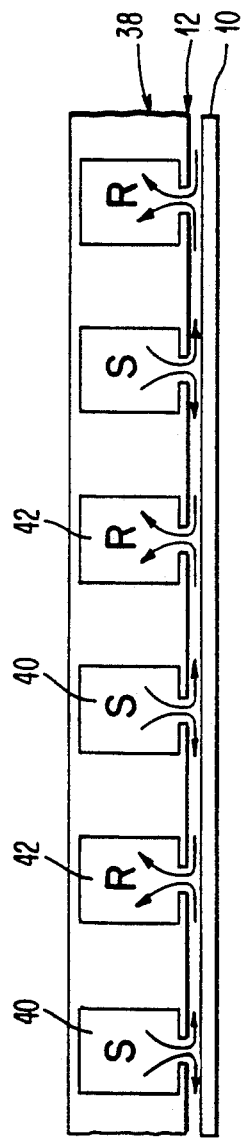
FIGS. 17 to 19 are side elevation views of embodiments of the invention illustrating the relationship between conduits and the faceplate.

FIG. 17 is a side elevation view of an embodiment of the invention. A facesheet 12 is disposed opposite a manifold sheet 38 separated by a small gap. The manifold sheet contains supply conduct 40 and return conduits 42. This facesheet 12 and manifold sheet 38 can be fabricated as several sheets laminated together or fabricated as a single integrated sheet.

Figure 18:
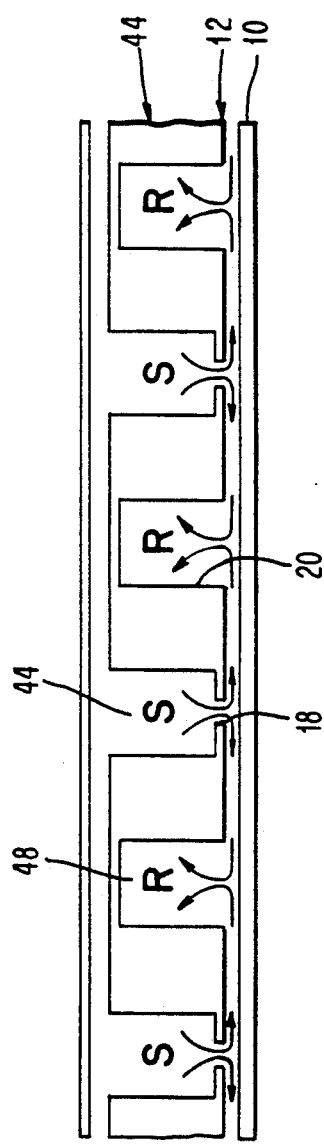

FIG. 18 shows another embodiment of the invention in which supply conduits 44 are located above a manifold on sheet 46 and the return conduits 48 are located below the sheet 46. Each supply nozzle 18 is a circular aperture or slot and each return nozzle 20 is a slot formed by the open face of a return conduit 48.

Figure 19:
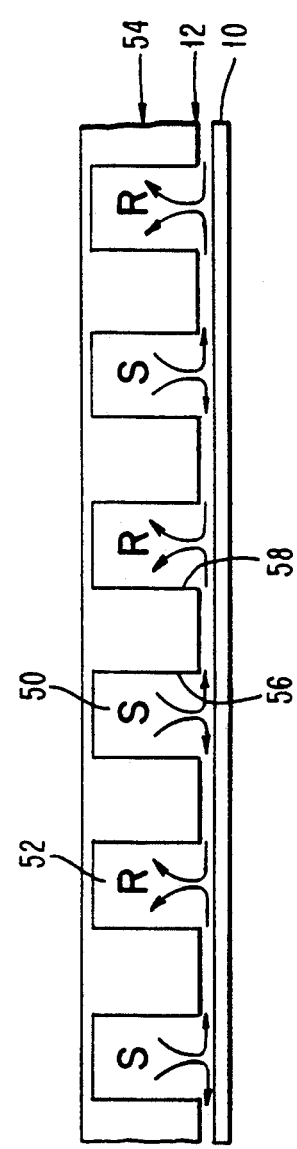

FIG. 19 shows still another embodiment of the invention. Both supply and return conduits 50 and 52 are at the bottom of the manifold sheet 54. The facesheet 12 is disposed opposite the manifold sheet 54 separated by a gap and the supply nozzles 56 and return nozzles 58 are slotted and coincide with the open conduits 50 and 52 respectively. The embodiment in FIGS. 5A and 5B are similar to the embodiment shown in FIG. 18. Supply nozzles 18' (FIG. 5B) penetrates partly through facesheet 12 and return capillaries 20" (FIG. 5B) and 48 (FIG. 18) are in the bottom of the facesheet 12.

Figure 20:
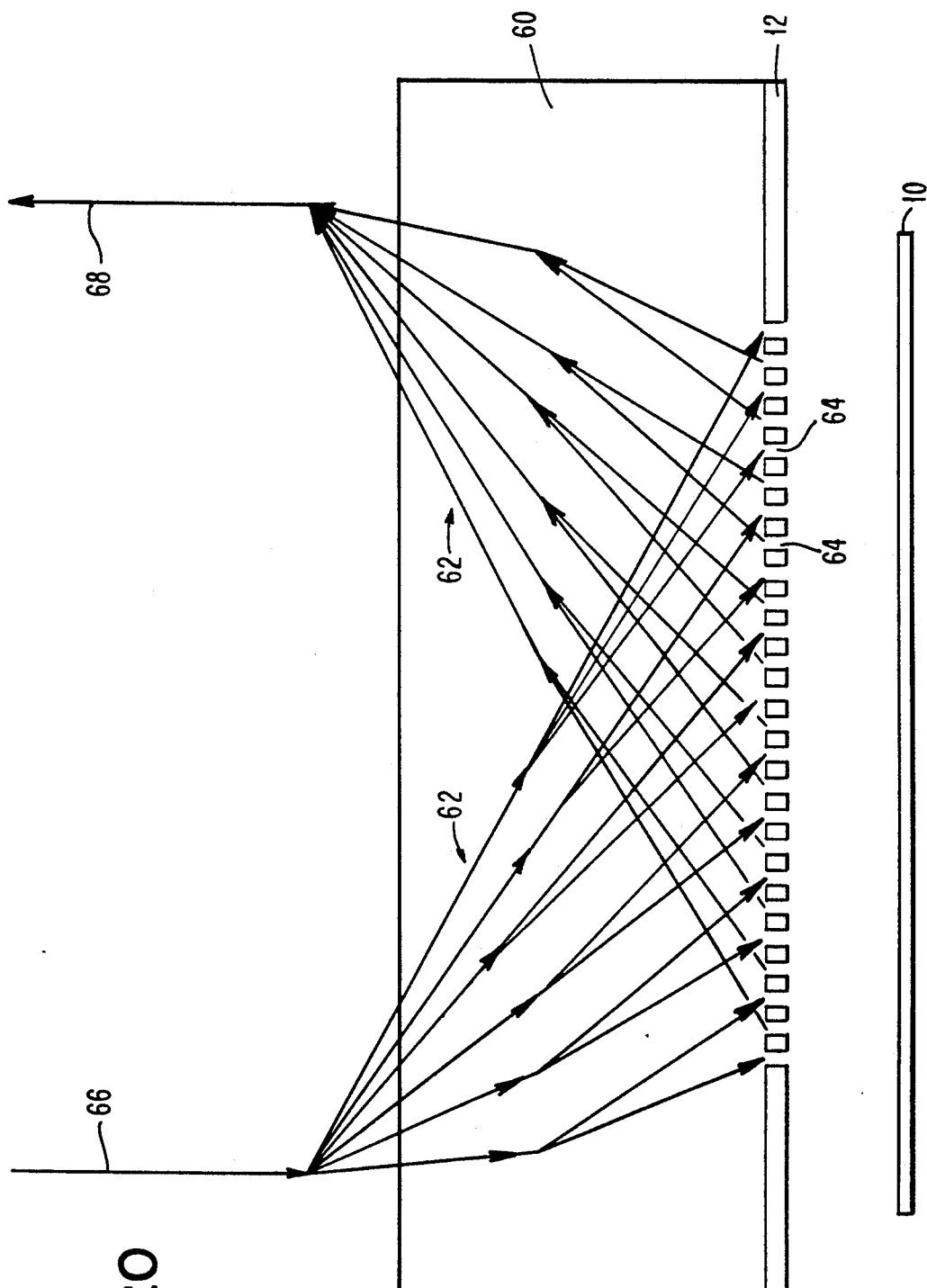
FIG. 20 is a semi-schematic blow-up of another embodiment of the invention.

FIG. 20 is a semi-schematic blow-up of another embodiment comprising a facesheet 12 and a separate manifold 60 with additional conduits for the supply channel, return channel, supply duct, return duct, supply port and return port. The conduits connect many finely spaced supply and return nozzles 64 in the facesheet 12 to a supply port 66 and a return port 68. It will be apparent that a facesheet containing a fine geometry, such as shown in FIG. 1 can have fluid supplied and returned by a manifold having different conduit sizes, such as centimeter scale ducts, millimeter scale channels, and sub-millimeter scale capillaries.

Figure 21:
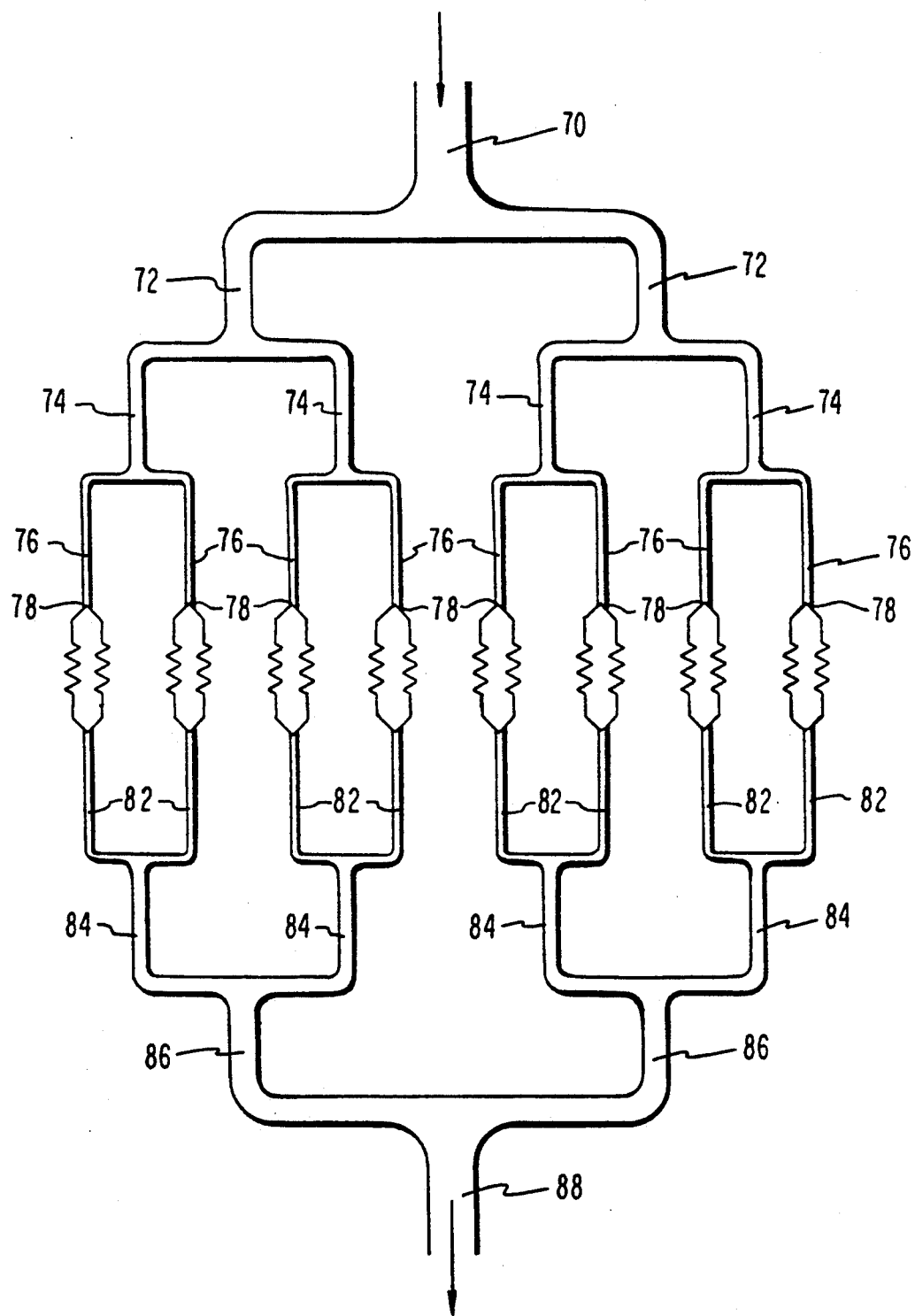
FIG. 21 is a schematic representation of the system flow topography.

FIG. 21 shows a simplified schematic representation of the system flow topology hierarchy. Supply fluid or coolant enters a supply port 70 where the fluid flows into a plurality (two shown) of supply duct segments 72 from which the fluid flows into a plurality of supply channel segments 74 to supply capillary segments 76 and finally to supply nozzle 78. The fluid then flows in a gap 90 adjacent to the coldsheet and then into a return nozzle 80, to a plurality of return capillary segment 82 into a return channel segment 84, to return duct segments 86 and finally to return port 88. In a closed system the heat is removed from the fluid and the fluid is returned to the supply port to repeat the above path. Depending upon the application more or less tiers form the hierarchy.

In order to achieve a well-controlled gap dimension in the presence of different perturbations, spacers 14 are used to separate the coldsheet 10 form the facesheet 20. In addition flexible coldsheets 10 and/or flexible facesheets 12 and/or a flexible manifold 60 may be employed in combination with a compressive force.

The spacers can be constructed integral with the facesheet, as a separate layer or structure in the assembly, integral with the coldsheet, or as attachments joining the coldsheet and the facesheet. In the first three mentioned spacer constructions, the gap width is controlled by providing coldsheet 10, spacers 14, and facesheet 12 having an intermediate value of stiffness and flexibility. That is, the elastic modulus, the thickness and overall geometry must be able to flex for vertical compliance and be hard enough that compressive spring forces and hydrostatic forces do not cause collapse nor bowing in the regions between the spacers. The facesheet 12 is preferably a medium-thin metal or T medium-thick hard plastic. If the spacers are used to attach or adhere between the facesheet and coldsheet, then the stiffness and flexibility considerations are much less critical.

The preferred facesheet construction uses shaping from a master pattern, including processes such as chemical machining, plating, molding, depositing, sputtering or die stamping. Both additive or subtractive processes can be used with either metal or plastic facesheets. For example a medium-thin metal sheet has nozzles etched through the sheet and spacers sputter deposited onto this sheet. Alternative methods fabricate the facesheet by photo-etching, plastic molding or die stamping.

In order to prevent corrosion or fouling during the life of the system self-passivating metals are preferred which can be fabricated by etching and/or sputtering. Fabrication by plating is often difficult with these metals.

In some applications, uniform heat convective transfer is desired across a large coldsheet area or other workpiece area. Such a process is referred to herein as "sheet-wise" convection, and is shown in FIG. 22A and 22B. For example, sheet-wise cooling is desirable to cool chips which are mounted extremely close together on a substrate. Also, sheet-wise cooling allows a standard cooling hat to cool modules containing chips of different sizes and at different locations. Etching a large printed circuit board also requires uniform sheet-wise convection. In other cases, particularly when there is non-uniform local heating density, in order to achieve uniform temperature non-uniform (i.e. personalized) cooling is required. In the plan view shown in 22A, the facesheet 92 is personalized by means of a non-uniform density of supply nozzles corresponding to the non-uniform heating density. Region 94 has the greatest density region 96 has a lesser density, and region 98 has the lowest density of supply nozzles.

Figures 23A, 23B:
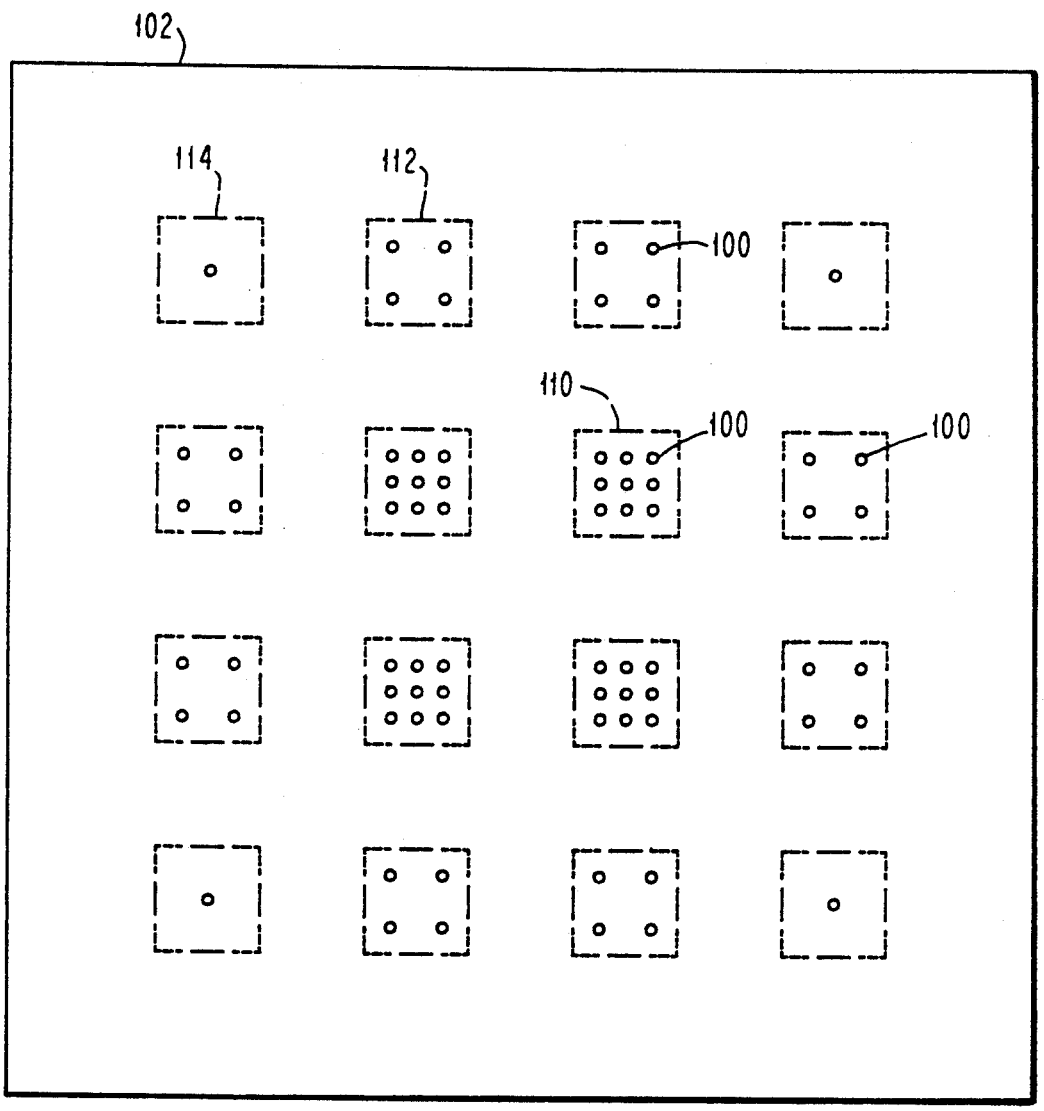
FIG. 23A is a top plan view of another facesheet useful for practicing the present invention.
FIG. 23B is the side elevation view of the facesheet shown in FIG. 23A.
Figure 24A:
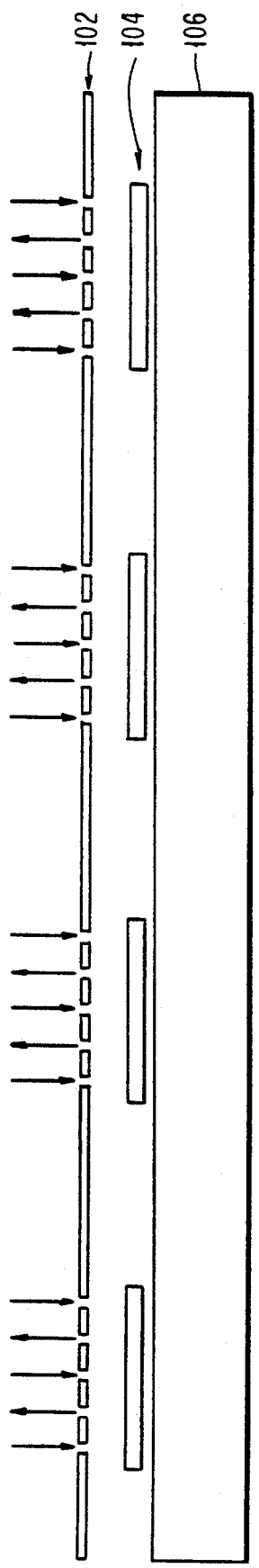
FIGS. 24A to 24D are schematic representations of personalization arrangements useful for practicing the invention.
Figure 24B:
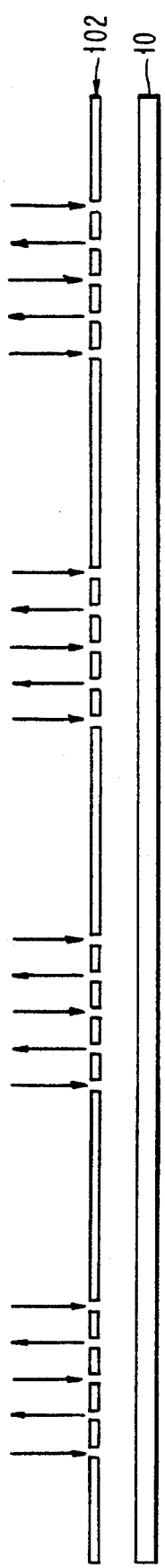
Figure 24C:
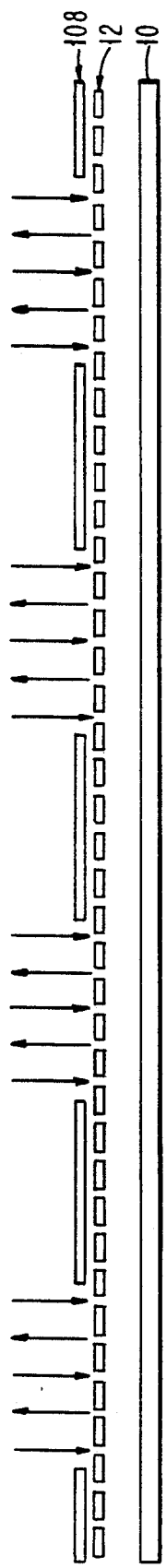
Figure 24D:
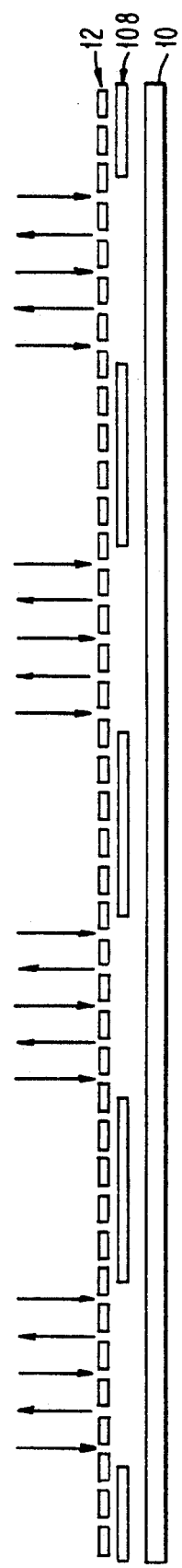

Sometimes, the non-uniformity is binary, for example when cooling small chips mounted relatively far apart. Such an arrangement is shown in FIGS. 23A and 23B and FIGS. 24A to 24D and will be referred to as "chip-wise" convection. The supply nozzles 100 are "personalized" and are located on the facesheet 102 only at locations where cooling is needed. In FIG. 24A a personalized facesheet 102 is located in proper spatial relationship with respect to integrated circuit chips 104 connected to a printed circuit board substrate 106. In FIG. 24B the personalized facesheet 102 is positioned directly above coldsheet 10. FIG. 24C shows a facesheet 12 containing a uniform distribution of supply nozzles and return nozzles, a personalized barrier 108 located in the path of the cooling fluid before reaching the barrier, which restricts the flow immediately above the facesheet. FIG. 24D illustrates the arrangement in FIG. 24C with the personalized barrier 108 located between the facesheet and coldsheet which barrier restricts the flow immediately under the facesheet as shown.

The use of a distinct personalized barrier 108 has certain advantages. For example, the barrier can be a tape spread over the surface of the facesheet, which tape is then cut, for instance by a laser. This arrangement facilitates using a conventional cooling hat and providing personalizing of the cooling system very late in the manufacturing process. In the worst case, after assembly and measurements of the actual heat dissipation of specific chips on a specific module is completed, a corresponding personalization barrier can be manufactured and added to the cooling system.

In still other cases, chips on a single printed circuit board have considerably different heating. Use of a barrier which enhances cooling to a larger or smaller area adjacent to each chip provides a substantially uniform temperature for all chips. FIG. 23A shows another solution to the unequal heating problem. The facesheet 102 is personalized at areas 110, 112 and 114 with different quantities and densities of supply nozzles 100.

Another important application for chip-wise convection is direct cooling, where the fluid directly contacts and directly cools each chip mounted upon a PCB substrate without intervening coldsheet cooling as shown in FIG. 24A. Cooling in such an embodiment is best achieved by using a chemically inert fluid (such as "Fluorinert" perfluorocarbon liquid from The 3M Company). The use of water would lead to corrosion of the electronics.

Figure 25A:
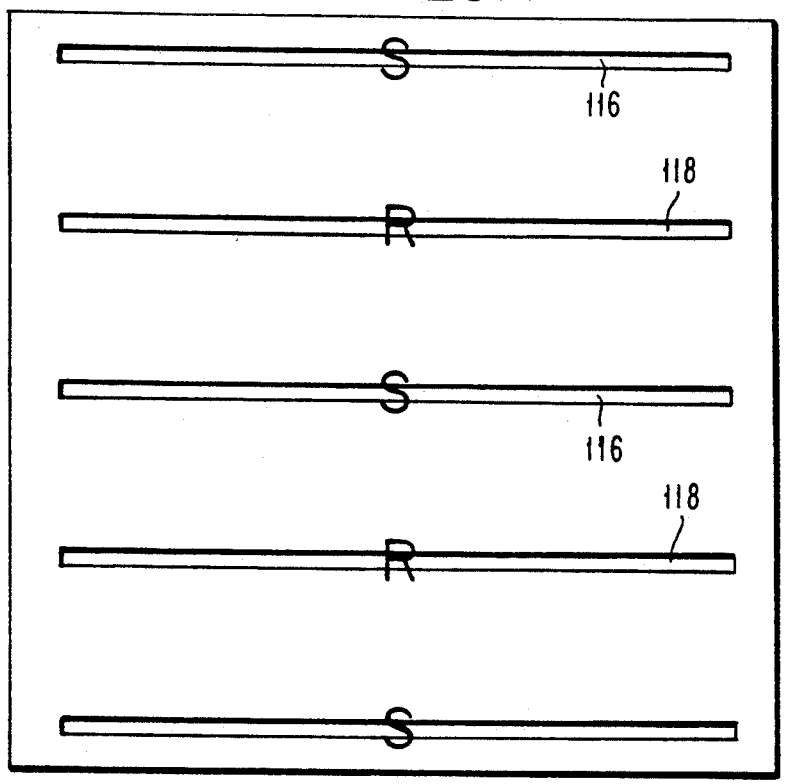
FIGS. 25A to 25D are schematic representations of personalization techniques.
Figure 25B:
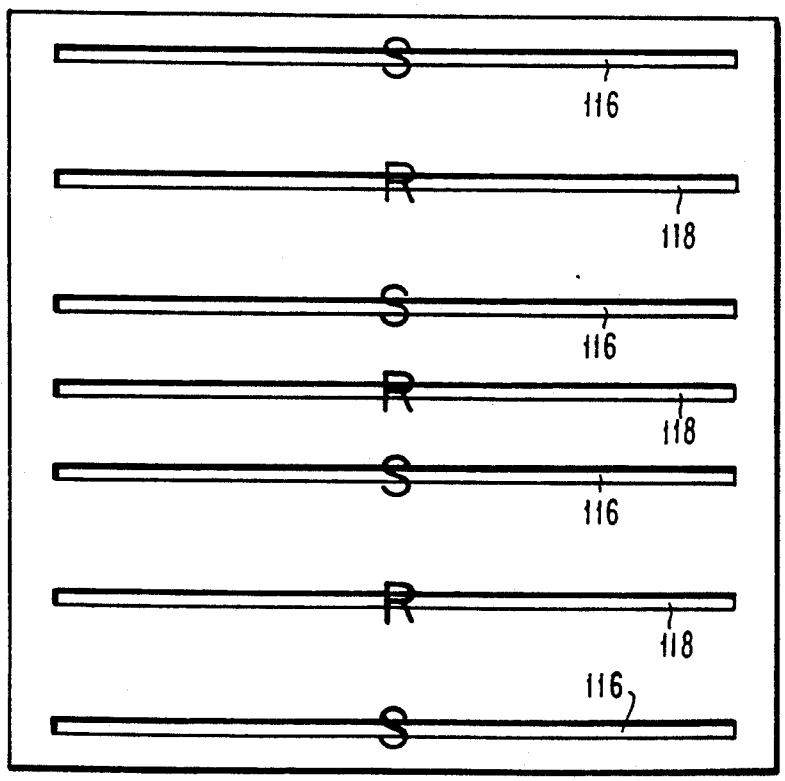
Figure 25C:
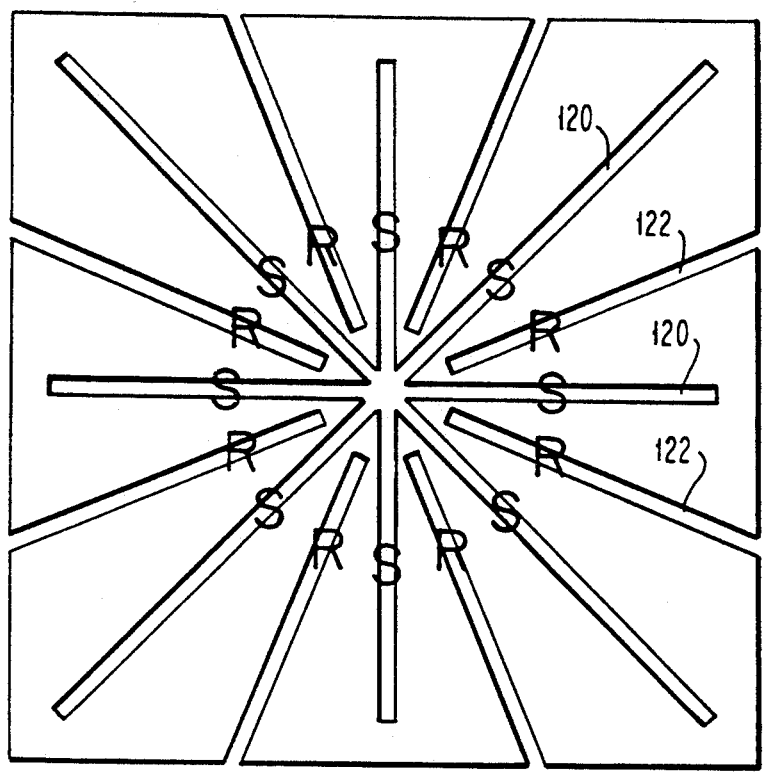
Figure 25D:
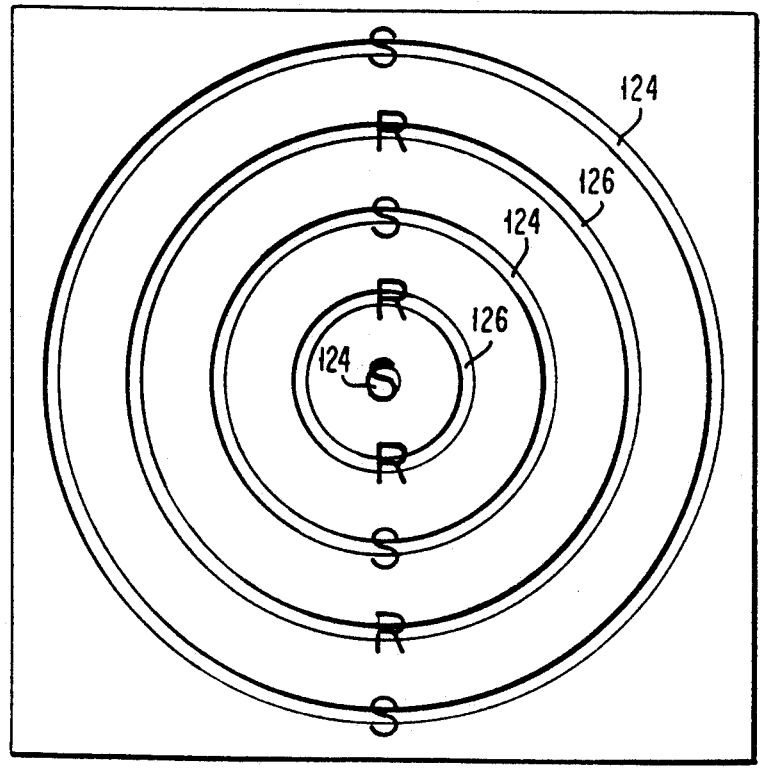

FIGS. 25A to 25D show personalization by means of slotted supply nozzles. FIG. 25A shows uniformly alternating supply slots 116 and return slots 118 for achieving uniform cooling. FIG. 25B shows non-uniformly spaced alternating supply slots 116 and return slots 118 in parallel for providing bands of non-uniform cooling. FIG. 25C shows radial alternating supply slots 120 and return slots 122 for more intense cooling in the center region of the sheet. FIG. 25D shows concentric alternating supply slots 124 and return slots 126 for more intense cooling near the center of the sheet. Similar concepts are applicable to other nozzle styles, such as shown in FIGS. 2 through 6.

Additional embodiments illustrating chip-wise convection are shown in FIGS. 26A to 26D and FIGS. 27A to 27C. The general structure is shown in FIG. 26A and FIG. 27B including a manifold sheet 128 with facechips 130 for cooling. The facechips will be described in detail below. The manifold sheet 128 has a fluid conduit 132 to the facechip 130 disposed opposite and close to the coldsheet 10. Spacers 14 (not shown) define a thin gap 16. Above the manifold sheet 128 are one or more supply ducts 134, and below the sheet 128 are one or more return ducts 136. The manifold sheet 128 is shaped so that the ducts 134 and 136 have sufficient cross section for proper fluid flow, and each facechip 130 is spaced adjacent to the coldsheet 10.

The gap geometry can be adjusted as follows. As shown by arrow 138, for example, there is a force which presses each manifold sheet 128 against the spacers 14 which, in turn, are urged against the coldsheet 10. The force can be provided by fluid pressure, by a spring, by stiffness or springiness implicit in the manifold sheet 128 or the fluid conduit 132, or by spacers 14 which attach the facechip 130 and coldsheet 10.

The duct geometry may be defined as follows. The manifold sheet 128 and/or the fluid conduit 132 are flexible (e.g.: by use of a thin material). In this case, a frame is provided to help define the overall shape. In some cases, fluid pressure helps define the correct duct shape. The manifold sheet 128 and/or conduits 132 are made semi-flexible or semi-stiff. The degree of stiffness helps define the duct geometry. Nevertheless, semi-flexibility allows bending of the sheet to define the gap. Similar results are achieved with a stiff manifold sheet 128 and soft conduits 132 or vice versa. When the manifold sheet 128 and conduits 132 are rigid, the overall cooling system is precisely adjusted to form the correct gap 16 dimension. In FIG. 26A the facechip 130 has a structure which is a tight cooling system similar to FIG. 6A and FIG. 6B. Supply nozzles 140 penetrate through the facechip 130. There are thin spacers 114 which define a thin gap 16. The bottom of each facechip 130 contains small slots which do not penetrate through the facechip. There are return nozzles and return capillaries 142 for carrying fluid horizontally (in the orientation drawn) to return ducts.

Figure 12A:
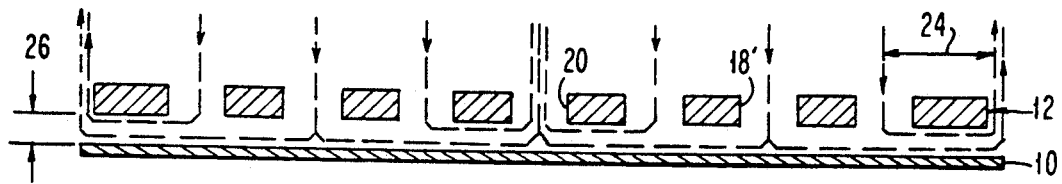
FIG. 12A is a side elevation section view of another embodiment of a facesheet for practicing the present invention.
Figure 12B:
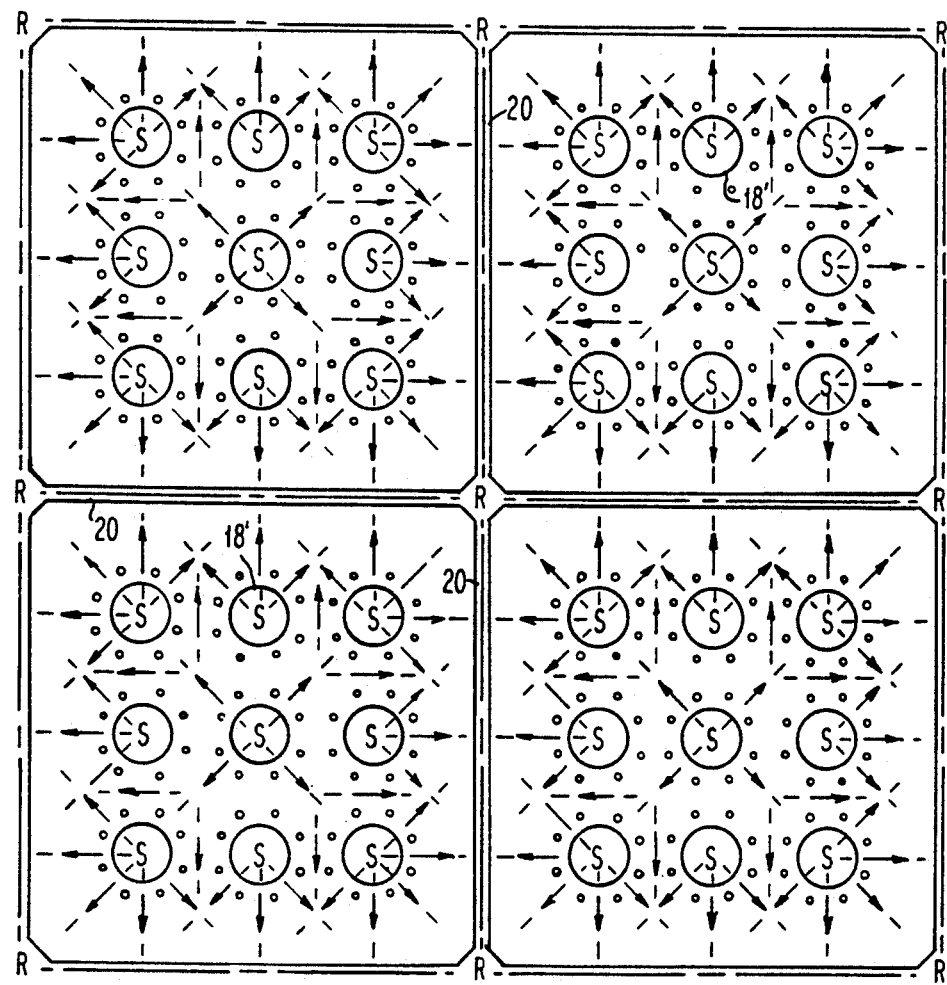
FIG. 12B is a top plan view of the facesheet shown in FIG. 12A.

In FIG. 26B by contrast, the chip 130 is a semi-relaxed structure, similar to the embodiment in FIGS. 12A and 12B. However, since the facechip is narrow, the need to fabricate return capillaries or return nozzles in the bottom of the facechip is obviated. This method is not preferred for use with a large facechip.

Still more generally, the facechip structure can use any of the described embodiments, including FIG. 1 through FIGS. 12A and 12B. In some cases, each facechip 130 includes a chip-sized manifold just above the facechip, for vertically (as drawn) receiving fluid from supply duct 134 and horizontally providing fluid to return duct 136. FIG. 26C shows a slightly different structure. In FIG. 27C a manifold sheet 128 has necks 144 which carry facechips 130. Since the sheet is semi-flexible, the necks 144 are stiff. FIG. 26D shows a slightly different structure including bellows 146 which carry facechips 130. Since the bellows provide flexibility, the sheet is allowed to be stiff.

FIGS. 27A to 27C illustrate several fabrication methods for the structure in FIG. 26A. Corresponding fabrication methods apply to FIGS. 26B to 26D. The manifold sheet 128 and facechips 130 can be fabricated from one or two or several layers of material (together with appropriate patterning), and/or assembled from multiple discrete components. Fabrication processes include addition, subtraction, or inelastic forming. Some examples are etching, surface molding, plating, forming, bending, sputtering, deposition and the like. These materials can be metal, plastic, various laminates or composites, and the like.

FIG. 27A shows fabrication as one layer. For example, the manifold sheet 128 and integral facechips 130 are made from a thin piece of metal or tough polymer (e.g.: Kapton). The facechip structures (e.g.: nozzles, spacers, capillaries) are fabricated onto the sheet. One method is to apply the material over a mandrel with all the necessary three dimensional geometry. Another method is to start with a flat sheet, remove material, then form (inelastically bend) the sheet to define the ducts. A third method is to additively construct a flat sheet with the facechip structures, then form the sheet to define ducts.

FIG. 27B shows two layer fabrication. For example, metal facechips 130 and a plastic manifold sheet 128 are fabricated similar to a printed circuit board by starting with a metal/plastic laminate and etching the facechip structure. Equivalently, start with a plastic sheet and plate the facechip structure onto the sheet. In either case, form (inelastically bend) the laminate to define the ducts.

Similar concepts apply to three or more layer fabrication. For example, additional layers facilitate including a chip-sized manifold within each facechip.

FIG. 27C shows an assembly comprising multiple pieces. Facechips 130 are individually fabricated and bonded to a manifold sheet 128. The sheet has holes made by etching or molding and is curved by forming or molding.

Also there are intermediate cases which combine fabrication and assembly. For example, electroless deposition of amorphous nickel is used to fabricate a unified bellows and facechip. Then several of these assemblies are assembled to a manifold sheet.

An embodiment which was constructed and tested included a substrate containing a 6 by 6 array of a chips, with chip pitch of 8.5 mm and chip size 4.5 mm. Adjacent to each chip was a thermal joint having a thickness in the range between 25 and 50 $\mu$m. The thermal joint conducts heat to the coldsheet. The coldsheet is made of "Art-Cast" molybdenum, 0.125 mm thick. In some cases, spacers are cut from double-stick tape and placed between the facesheet and coldsheet. In other cases, spacers are etched into the coldsheet. The nominal thickness of the spacers and gap is typically 0.038 mm.

The facesheet was fabricated as follows. The supply and return nozzles were alternating supply and return parallel slots, each having a width of 1.063 mm=8.5 mm/8, and a depth of 1.5 mm. The segment length was 2.125 mm=8.5 mm/4, as measured between adjacent supply and return nozzles.

Beyond the facesheet was a duct block, with supply and return ducts having a 8.5 mm pitch. The cooling fluid is pure water, at a flow density FD=5 cm/sec. In other words, the flow was 0.13 liter/sec (2.0 GPM) spread uniformly across 5.1 cm$^2$. The total pressure drop was 0.10E5 Pascals (1.45 PSI). The inlet water temperature was 22.5° C. At a power of 53.9 W/chip, the temperature at the center of the chip was 85° C., so the temperature drop was $\Delta T$=62.5° C.=85°−22.5° C.

To help extrapolate to other cases, the raw data can be normalized several ways. Normalized to a standard temperature drop $\Delta T$=60° C. This implies a power of 51.7 W/chip. Further normalized to the chip area of 0.202 cm$^2$. This implies an average power area density of 256 W/cm$^2$. Alternatively, normalized to the chip perimeter of 1.8 cm, this implies an average power lineal density of 28.7 W/cm.

To increase the cooling, use one of the preferred embodiment, such as that shown in FIGS. 1 through 6 with a smaller gap, or shorter segments, or circular supply nozzles. Alternatively, increase the local density, either by concentrating the flow near each chip (chip-wise cooling), and/or by increasing the total flow. The above result includes extraneous thermal resistance due to the composition of the thermal joint.

Other variations and modification to the present invention follow. In the prior art it is known to increase heat transfer by using structures which stir the boundary layer. Such a technique can be used with the present invention. For example, a very shallow stirrer, such as a very fine wire screen may be placed between the coldsheet and the facesheet where it also acts as a spacer layer. The result is more intense convection by stirring with low pressure and uniform convection.

Heat transfer can be greatly improved by the addition of a structure of the present invention superimposed on the surface of each large fin in a convectional large fin cooling arrangement.

The preferred embodiment depends on the application. For a typical multichip module, with many chips mounted on a common substrate, the pitch between chips is significantly larger than the chip size. In such an arrangement a chip-wise embodiment is preferred.

For fabricating (etching or plating) printed circuit boards, a uniform fabrication rate is usually important. Therefore a sheet-wise embodiment is preferred. This particular application precludes the workpiece being textured or the use of structure to promote stirring and heat transfer on this workpiece. However, the adjacent facesheet may have such texture or structure. A truly smooth workpiece is required.

As noted before, the preferred embodiment depends on the application. For sheet-wise cooling, FIG. 28 and FIG. 29 show a preferred embodiment, which integrates several of the concepts described above.

FIG. 1 shows facesheet 12 and coldsheet 10 with an intervening fine gap 16 and short segment distances. FIGS. 3A and 3B show a facesheet 12 containing circular supply nozzles 18' and slotted return nozzles 20'. FIG. 18 shows a facesheet 10 containing supply conduits 44 and return conduits 48. FIG. 20 shows a manifold 60 containing channels 62. FIG. 21 shows capillary J segments (small size conduits) 76 and channel segments (medium size conduits) 74. FIG. 28 is a vertical cross section, and FIG. 29 is a cutaway plan view of a preferred embodiment of the invention. The line marked A1-A2 locates the vertical cross section on the horizontal cutaway.

Fluid flows as follows: cold fluid is supplied through a supply channel 148 located in a part of the manifold 60. Cold fluid spreads through several small supply capillaries 150 in the facesheet 12. Cold fluid passes through many circular supply nozzles 152 which penetrate the facesheet 12. Then fluid flows through a thin gap 16 defined by spacers 14. Thus fluid flows along a short segment 154, and absorbs heat from the adjacent coldsheet 10. Next warm fluid returns through return capillaries 158 and through return channels 160 in part of the manifold 60. Other nozzle configurations, such as those described above may also be used.

While there has been described and illustrated preferred embodiments of convective transfer systems and variations and modifications thereof, it will be apparent to those skilled in the art that further variations and modifications are possible without deviating form the broad scope of the present invention which shall be limited solely by the scope of the claims appended hereto.

What is claimed is:

1. A system for convective transfer from a smooth coldsheet comprising:

fluid supply means including a plurality of supply nozzles;

fluid return means including a plurality of return nozzles; and a facesheet coupled to said fluid supply means and said fluid return means disposed opposite the smooth coldsheet thereby forming a gap between said facesheet and the coldsheet so that a fluid flows through said fluid supply means and said plurality of supply nozzles along short segments through the gap and through said plurality of return nozzles and said fluid return means, where the length of said segment is less than approximately 32 times the gap distance between said facesheet and the coldsheet.

2. A system as set forth in claim 1, wherein the Reynold's number of said gap is less than 300.

3. A system as set forth in claim 1, wherein the gap thickness is less than 0.5 mm and each segment length is less than 10 mm.

4. A system as set forth in claim 1, wherein said gap has a hydraulic diameter and said supply means has a hydraulic diameter, further the Reynolds' number of the gap is less than 100 and the length of said segment is less than 8 times the lesser of the hydraulic diameter of said gap and the hydraulic diameter of said supply means.

5. A system as set forth in claim 1, wherein said gap has a hydraulic diameter and the Reynolds' number of the gap is less than 100 and the length of said segment is less than 8 times the hydraulic diameter of said gap.

6. A system as set forth in claim 1, wherein said fluid supply means and said fluid return means further comprise conduits.

7. A system as set forth in claim 6, wherein said nozzle and said conduit are slotted.

8. A system as set forth in claim 6, wherein said nozzle is round.

9. A system as set forth in claim 6, wherein said nozzle is in the form of a grid.

10. A system as set forth in claim 6, wherein said conduit is in the form of a grid.

11. A system as set forth in claim 1, further comprising spacer means disposed between said facesheet and the coldsheet for determining the gap thickness.

12. A system as set forth in claim 1, wherein said fluid supply means, said fluid return means and said facesheet are coupled for providing personalized cooling of the coldsheet.

13. A system as set forth in claim 12, further comprising a personalized barrier.

14. A system as set forth in claim 1, further comprising a compliant manifold and said fluid supply means and said fluid return means are disposed in said manifold.

15. A system as set forth in claim 1, wherein the fluid is cryogenic.

16. A system for convective transfer comprising:
a plurality of fluid supply means;
a plurality of fluid return means; and
a facesheet coupled to said plurality of fluid supply means and said plurality of fluid return means whereby when said facesheet is disposed opposite a smooth coldsheet a plurality of gaps are formed therebetween so that a fluid flows through said plurality of fluid supply means, through a plurality of topologically parallel flow segments through the plurality of gaps and through said plurality of fluid return means, where said segments are less than approximately 32 times the gap formed between said facesheet and the coldsheet.

17. A system as set forth in claim 16, wherein said plurality of fluid supply means have a narrow hydraulic diameter.

18. A system as set forth in claim 16, wherein said plurality of gaps have a small hydraulic diameter.

* * * * *